US011888076B2

(12) United States Patent
Yamamoto et al.

(10) Patent No.: US 11,888,076 B2
(45) Date of Patent: Jan. 30, 2024

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Soichiro Shibasaki, Nerima Toyko (JP); Yuya Honishi, Saitama Saitama (JP); Naoyuki Nakagawa, Setagaya Toyko (JP); Mutsuki Yamazaki, Yokohama Kanagawa (JP); Yoshiko Hiraoka, Kawasaki Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 149 days.

(21) Appl. No.: 17/469,940

(22) Filed: Sep. 9, 2021

(65) Prior Publication Data
US 2021/0408315 A1 Dec. 30, 2021

Related U.S. Application Data

(63) Continuation of application No. PCT/JP2020/012535, filed on Mar. 19, 2020.

(51) Int. Cl.
*H01L 31/05* (2014.01)
*H01L 31/0224* (2006.01)
(Continued)

(52) U.S. Cl.
CPC .. *H01L 31/0512* (2013.01); *H01L 31/022466* (2013.01); *H01L 31/0508* (2013.01); *H01L 31/073* (2013.01); *H01L 31/0725* (2013.01)

(58) Field of Classification Search
CPC ..... H01L 31/022433; H01L 31/022466; H01L 31/0336; H01L 31/0392; H01L 31/0508;
(Continued)

(56) References Cited

U.S. PATENT DOCUMENTS

| 6,376,765 B1 * | 4/2002 | Wariishi | H01G 9/2009 |
| | | | 429/324 |
| 2002/0040728 A1 * | 4/2002 | Yoshikawa | H01G 9/2009 |
| | | | 429/111 |

(Continued)

FOREIGN PATENT DOCUMENTS

| CN | 106935668 | 7/2017 |
| CN | 109585582 | 4/2019 |

(Continued)

OTHER PUBLICATIONS

International Search Report and Written Opinion for International Application No. PCT/JP2020/012535 dated Jun. 16, 2020, 9 pgs.

(Continued)

*Primary Examiner* — Golam Mowla
(74) *Attorney, Agent, or Firm* — Amin, Turocy & Watson, LLP

(57) ABSTRACT

A solar cell of an embodiment includes: a transparent substrate; a p-electrode on the substrate, the p-electrode including a first p-electrode containing an Sn-based metal oxide, a second p-electrode having an opening and consisting of a wiring containing a metal or graphene, and a third p-electrode containing an In-based metal oxide; a p-type light absorbing layer in direct contact with a surface of the first p-electrode on a side opposite to the second p-electrode (Continued)

side; an n-type layer provided on the p-type light absorbing layer; and an n-electrode provided on the n-type layer. The third p-electrode is provided to be present between the first p-electrode and the second p-electrode and to be in direct contact with an upper surface of the second p-electrode. An entire side surface of the second p-electrode is in direct contact with the first p-electrode.

20 Claims, 11 Drawing Sheets

(51) Int. Cl.
*H01L 31/0725* (2012.01)
*H01L 31/073* (2012.01)

(58) Field of Classification Search
CPC .................. H01L 31/0512; H01L 31/0725; H01L 31/073
See application file for complete search history.

(56) References Cited

U.S. PATENT DOCUMENTS

| | | | | |
|---|---|---|---|---|
| 2006/0162770 | A1* | 7/2006 | Matsui | H01G 9/2031 136/263 |
| 2015/0179835 | A1 | 6/2015 | Chien et al. | |
| 2019/0386161 | A1 | 12/2019 | Shibasaki et al. | |
| 2020/0006583 | A1 | 1/2020 | Shibasaki et al. | |
| 2020/0006589 | A1 | 1/2020 | Yamamoto et al. | |

FOREIGN PATENT DOCUMENTS

| | | |
|---|---|---|
| EP | 2669952 | 12/2013 |
| JP | 2003-331934 | 11/2003 |
| JP | 2005-239526 | 9/2005 |
| JP | 2006-124754 | 5/2006 |
| JP | 3828029 | 9/2006 |
| JP | 2010-027662 | 2/2010 |
| JP | 2012-186415 | 9/2012 |
| JP | 2012-209400 | 10/2012 |
| JP | 2013-089807 | 5/2013 |
| JP | 2017-098479 | 6/2017 |
| JP | 2018-046196 | 3/2018 |
| JP | 2019-169545 | 10/2019 |
| WO | 2019/146119 | 8/2019 |
| WO | 2019/146120 | 8/2019 |

OTHER PUBLICATIONS

Minami, et al., "High-efficiency solar cells fabricated using oxide semiconductors", Applied Physics, vol. 86, No. 8 (2017).

Nishi, "A Study of High-Efficiency Heterojunction Solar Cells Using a Cu2O Sheets as p-type Oxide semiconductor Layer", Kenjiro Takayanagi Foundation, Jan. 2017.

Minami, et al., "Cu2O-based solar cells using oxide semiconductors", Journal of Semiconductors, vol. 37, No. 1, 2016.

Minami, et al., "Efficiency enhancement using a Zn1—xGex—O thin film as an n-type window layer in Cu2O-based heterojunction solar cells", Applied Physics Express 9, 052301, 2015.

Kaur, et al., "Localized surface plasmon induced enhancement of electron-hole generation with silver metal island at n—Al:ZnO/p—Cu2O heterojunction", Applied Physics Letters 107, 053901, 2015.

Lee, et al., "Atomic Layer Deposited Gallium Oxide Buffer Layer Enables 1.2 V Open-Circuit Voltage in Cuprous Oxide Solar Cells", Advanced Materials, 2014, 26, pp. 4704-4710.

Shibasaki, et al., "Transparent Cu2O solar cell for high-efficiency and low-cost tandem photovoltaics" Proceedings of 2019 IEEE 46the Photovoltaic Specialists Conference (PVSC), 2019, pp. 1061-1063.

* cited by examiner

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Application PCT/JP2020/012535, the International Filing Date of which is Mar. 19, 2020 the entire contents of which are incorporated herein by reference.

FIELD

Embodiments described herein relate generally to a solar cell, a multi-junction solar cell, a solar cell module, and a photovoltaic power generation system.

BACKGROUND

As one of novel solar cells, there is a cuprous oxide ($Cu_2O$) solar cell. $Cu_2O$ is a wide-gap semiconductor having a bandgap of, for example, 2.1 eV. $Cu_2O$, which includes copper and oxygen existing abundantly on the earth, is a safe and inexpensive material. Therefore, $Cu_2O$ is expected to realize a solar cell with high efficiency and low cost.

The $Cu_2O$ layer of the $Cu_2O$ solar cell forms a low-resistance contact with a high-cost Au film electrode, but when the Au film electrode is used, the peel strength between the Au film electrode and the $Cu_2O$ layer is not so high. Further, a transmissive solar cell can be produced by using $Cu_2O$ for the light absorbing layer, but when the Au film electrode is used, a transmissive solar cell cannot be produced even when $Cu_2O$ is used for the light absorbing layer.

DETAILED DESCRIPTION

A solar cell of an embodiment includes: a transparent substrate; a p-electrode on the substrate, the p-electrode including a first p-electrode containing an Sn-based metal oxide, a second p-electrode having an opening and consisting of a wiring containing a metal or graphene, and a third p-electrode containing an In-based metal oxide; a p-type light absorbing layer in direct contact with a surface of the first p-electrode on a side opposite to the second p-electrode side; an n-type layer provided on the p-type light absorbing layer; and an n-electrode provided on the n-type layer. The third p-electrode is provided to be present between the first p-electrode and the second p-electrode and to be in direct contact with an upper surface of the second p-electrode. An entire side surface of the second p-electrode is in direct contact with the first p-electrode.

Hereinafter, an embodiment of the present disclosure will be described in detail with reference to drawings. Physical properties described in the specification are values at 25° C. and in an atmospheric pressure unless otherwise specified.

First Embodiment

Figure 1:
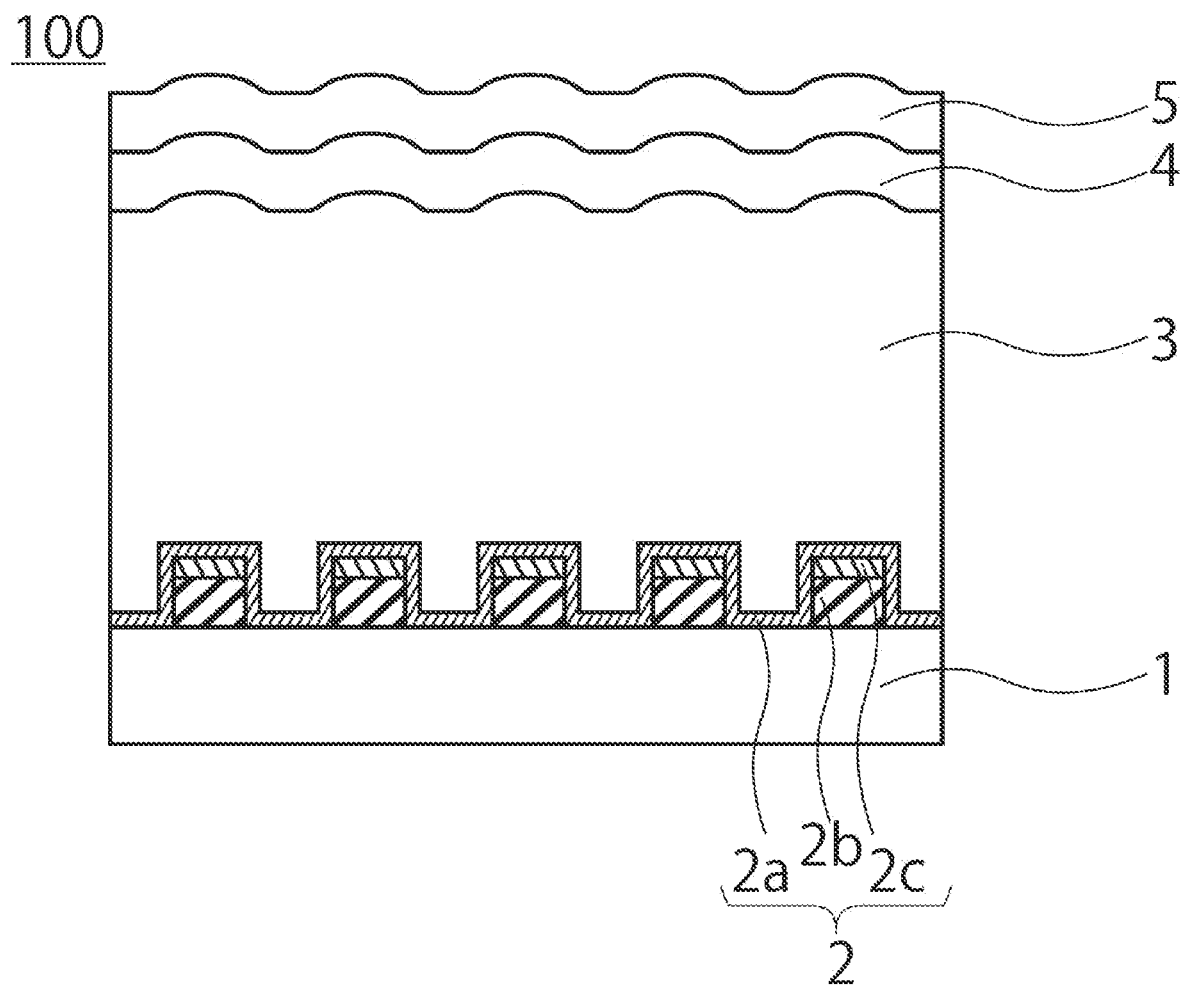
FIG. 1 is a cross-sectional view of a solar cell of an embodiment.

A first embodiment relates to a solar cell. FIG. 1 is a cross-sectional view of a solar cell 100 of the first embodiment. As shown in FIG. 1, the solar cell 100 according to this embodiment includes a substrate 1, a p-electrode 2, a p-type light absorbing layer 3, an n-type layer 4, and an n-electrode 5. An intermediate layer (not illustrated) may be included for example between the n-type layer 4 and the n-electrode 5. Sunlight may enter the solar cell 100 from either the n-electrode 5 side or the p-electrode 2 side. It is more preferable that sunlight enter the solar cell 100 from the n-electrode 5 side. Because the solar cell 100 of the embodiment is a transmissive solar cell, it is preferably used as a top cell (light incident side) of a multi-junction solar cell.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light absorbing layer 3. The p-electrode 2 includes a first p-electrode 2a, a second p-electrode 2b, and a third p-electrode 2c. The second p-electrode 2b is located on the substrate 1 side. The first p-electrode 2a and the second p-electrode 2b overlap each other. A surface of the first p-electrode 2a facing the p-type light absorbing layer 3 is disposed closer to the p-type light absorbing layer 3 than a surface of the second p-electrode 2b facing the p-type light absorbing layer 3. The third p-electrode 2c exists between the first p-electrode 2a and the second p-electrode 2b, and is provided so as to be in direct contact with an upper surface of the second p-electrode.

The first p-electrode 2a is a transparent conductive film containing an Sn-based metal oxide. No less than 92 atom % of the metals of the Sn-based metal oxide in the first p-electrode 2a is Sn. The first p-electrode 2a is an electrode in direct contact with the p-type light absorbing layer 3. The first p-electrode 2a is desirably provided in such a manner that it covers the second p-electrode 2b.

The second p-electrode 2b has an opening and is consisting of a wiring containing a metal and/or graphene. The second p-electrode 2b is an electrode in direct contact with the first p-electrode 2a but not with the p-type light absorbing layer 3. The wiring that forms the second p-electrode 2b is a light reflecting metal (not a compound such as an oxide) or graphene. The cross-sectional shape of the second p-electrode 2b is typically a polygon or a trapezoid including a case where the corners are rounded.

The third p-electrode 2c contains an In-based metal oxide. The third p-electrode 2c is disposed between the first p-electrode 2a and the second p-electrode 2b. The third p-electrode 2c is preferably consisting of an In-based metal oxide. No less than 60 atom % of the metals contained in the oxide of the third p-electrode 2c is In. When the third p-electrode 2c is produced on the first p-electrode 2a, a resist pattern is formed on the p-electrode first. In the resist pattern, there is a resist film in a region to be an opening of a linear wiring of Ag, and there is no resist film in a region to be a wiring portion. The resist pattern is formed by a method such as a nanoimprint method or photolithography. Next, the first p-electrode 2a and the third p-electrode 2c are sequentially deposited.

The p-electrode 2 of the embodiment has a structure in which the second p-electrode 2b, which has a wiring form with a third p-electrode 2c provided on an upper surface and has an opening portion, and the first p-electrode 2a, which is an Sn-based transparent conductive oxide, are laminated. By adopting such a structure, adhesion is further improved while achieving both high transmittance and good contact.

When only the second p-electrode 2b is provided between the substrate 1 and the light absorbing layer 3, the second p-electrode 2b is in contact with the light absorbing layer 3 with high resistance. Because of this, it is not preferable to use the second p-electrode 2b alone as the p-electrode 2. When the second p-electrode 2b alone is the p-electrode 2, peeling easily occurs at the interface between the substrate 1 and the second p-electrode 2b, and peeling also easily occurs at the interface between the substrate 1 and the light absorbing layer 3.

When only the first p-electrode 2a is provided between the substrate 1 and the light absorbing layer 3, the adhesion between the p-electrode 2 and the substrate 1 and the adhesion between the p-electrode 2 and the light absorbing layer 3 are good, but the loss due to the p-electrode 2 increases because the first p-electrode 2a has high resistance.

The p-electrode 2 of the embodiment further includes a third p-electrode 2c between the first p-electrode 2a and the second p-electrode 2b. The first p-electrode 2a and the second p-electrode 2b do not have very high adhesion. The third p-electrode 2c provided between the first p-electrode 2a and the second p-electrode 2b improves the adhesion. For example, Indium Tin Oxide (ITO) is used for the third p-electrode 2c. ITO has excellent adhesion to the second p-electrode 2b, the substrate 1, and the like, and has lower resistance than $SnO_2$, but easily absorbs near-infrared light (light having a wavelength range of about 1,000 nm to 1,200 nm) that has wavelengths of the absorption band of Si. Therefore, when the solar cell according to the embodiment is used for a multi-junction solar cell, ITO cannot be used as a substitute for the first p-electrode 2a. Due to a difference in thermal expansion coefficient between ITO and the substrate 1 or the like, warpage may already occur at the time when ITO is deposited on the substrate 1. When the solar cell is a small cell for experiment, it is unlikely to cause a problem even if the area ratio for forming ITO increases, but in a solar cell of an industrial size, the influence of warpage is large. Thus, ITO having a high area ratio is not suitable for the second p-electrode 2b of the solar cell 100 of the embodiment for the reasons of transmittance and thermal expansion coefficient.

The third p-electrode 2c is provided between the first p-electrode 2a and the second p-electrode 2b in such a manner that it is in direct contact with the upper surface of the second p-electrode 2b. More specifically, the third p-electrode 2c is in direct contact with the surface of the second p-electrode 2b opposite to the surface facing the substrate 1. The whole area of the side surfaces of the second p-electrode 2b are in direct contact with the first p-electrode 2a, and the side surfaces of the second p-electrode 2b are not in direct contact with the third p-electrode 2c. The third p-electrode 2c is in direct contact with the surface of the first p-electrode 2a facing the second p-electrode 2b in the lamination direction of the substrate 1 and the second p-electrode 2b. Because the third p-electrode 2c is provided in a non-opening portion of the second p-electrode on the second p-electrode 2b, there is substantially no decrease in light transmittance due to the third p-electrode 2c, and the third p-electrode 2c functions as an adhesive layer between the first p-electrode 2a and the second p-electrode 2b. When the first p-electrode 2a and the second p-electrode 2b are peeled off, the second p-electrode 2b serving as a substantial conductive path between the p-type light absorbing layer 3 and the p-electrode 2 is not electrically connected. Therefore, peeling in the p-electrode 2 is not preferable. From the viewpoint of preventing peeling, it is preferable that the whole area of the surface of the second p-electrode 2b opposite to the surface facing the substrate 1 is in direct contact with the third p-electrode 2c, and the whole of the surface of the first p-electrode 2a facing the second p-electrode 2b in the lamination direction of the substrate 1 and the second p-electrode 2b is in direct contact with the third p-electrode 2c (the entire upper surface of the second p-electrode 2b is in contact with the third p-electrode 2c). When the third p-electrode 2c is provided on a side surface (surface in which the second p-electrode 2b is in direct contact with first p-electrode 2a in the direction perpendicular to the lamination direction of the substrate 1 and the second p-electrode 2b) of the second p-electrode 2b, the third p-electrode 2c exists in the opening portion of the second p-electrode 2b, which causes a decrease in transmittance. In addition, when the third p-electrode 2c is provided on the side surface of the second p-electrode 2b as well, the area ratio of the third p-electrode 2c increases, which causes warpage of the solar cell 100. Therefore, the third p-electrode 2c is preferably provided only on the upper surface of the second p-electrode 2b.

Figure 2:
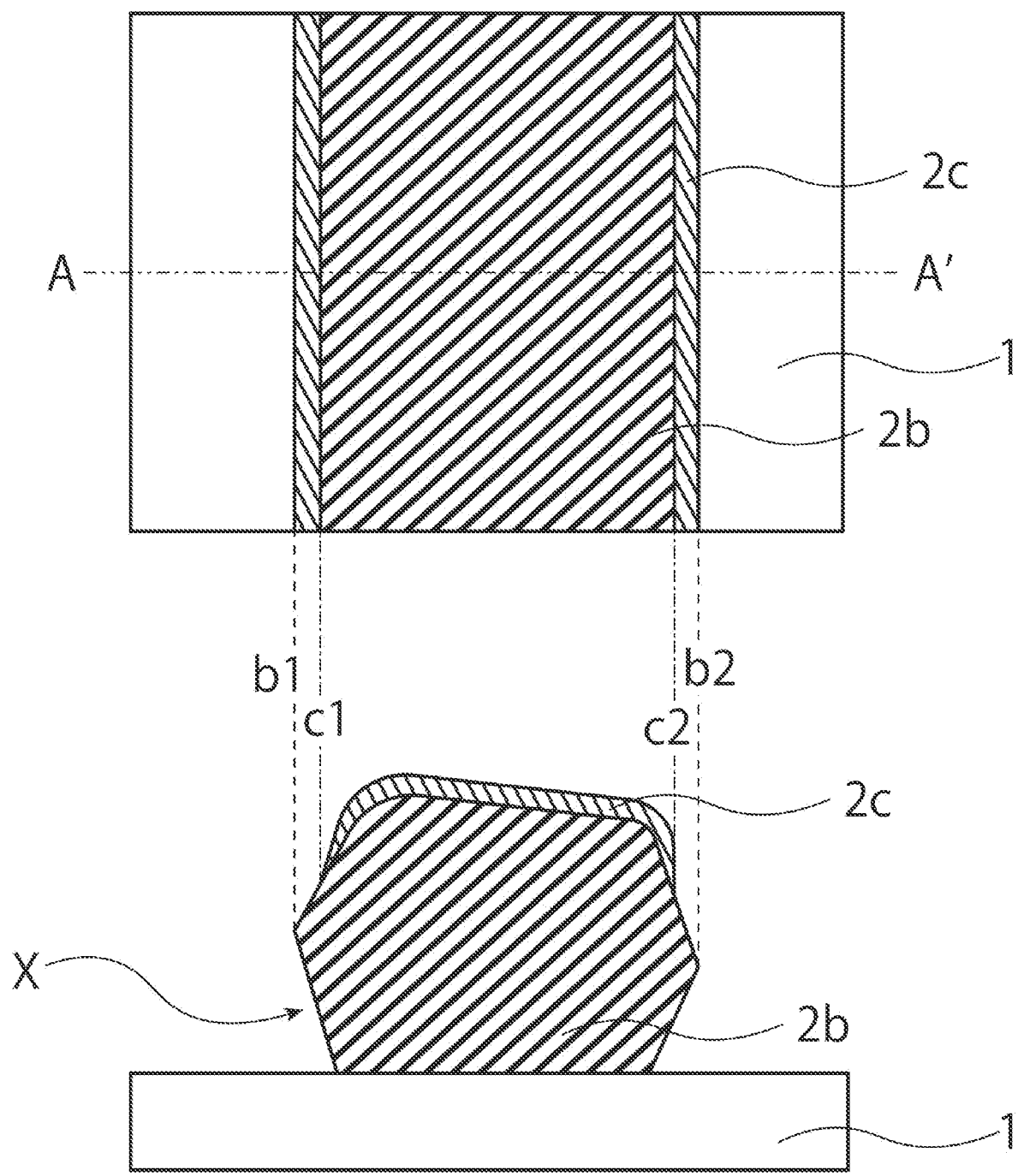
FIG. 2 is a schematic view illustrating a position where a third p-electrode is provided according to an embodiment.

When the third p-electrode 2c in direct contact with the second p-electrode 2b is located inside the second p-electrode 2b, the upper surface of the second p-electrode 2b is in direct contact with the third p-electrode 2c, and the side surfaces of the second p-electrode 2b are not in direct contact with the third p-electrode 2c. FIG. 2 is a schematic view illustrating a position where the third p-electrode 2c is provided. FIG. 2 schematically illustrates the substrate 1, one second p-electrode 2b, and one third p-electrode 2c. The upper side of FIG. 2 is a schematic view of the third p-electrode 2c and the like observed from the n-type layer 4 side in the lamination direction of the p-type light absorbing layer 3. The lower side of FIG. 2 is a schematic cross-sectional view taken along the line A-A' of the schematic view on the upper side of FIG. 2. The outermost positions of the second p-electrode 2b are b1 and b2, and the outermost positions of the third p-electrode 2c are c1 and c2. In a case where the position of c1 overlaps with b1 or is inside b1, and the position of c2 overlaps with b2 or is inside b2, the upper surface of the second p-electrode 2b is in direct contact with the third p-electrode 2c, and the side surfaces of the second p-electrode 2b are not in direct contact with the third p-electrode 2c. When the position of c1 overlaps with b1 and the position of c2 overlaps with b2, the entire upper surface of the second p-electrode 2b is in direct contact with the third p-electrode 2c, and the side surfaces of the second p-electrode 2b are not in direct contact with the third p-electrode 2c. Note that the surface X in FIG. 2 is neither the surface of the second p-electrode 2b facing the substrate 1 nor the surface of the second p-electrode 2b opposite to the surface facing the substrate 1, and thus the surface X corresponds to a side surface of the second p-electrode 2b.

As shown in FIG. 1, the second p-electrode 2b, which is a wiring, is preferably provided in such a manner that the second p-electrode 2b on the substrate 1 is covered with the first p-electrode 2a. The whole area of the surface of the light absorbing layer 3 on the side opposite to the n-electrode 5 side is preferably in direct contact with the whole area of the surface of the first p-electrode 2a on the side facing the n-electrode 5 side.

Because the Sn-based metal oxide in the first p-electrode 2a is in ohmic contact with the p-type light absorbing layer 3, the whole area of the surface of the p-type light absorbing layer 3 facing the first p-electrode 2a is preferably in direct contact with the first p-electrode 2a. For the same reason, the whole area of the surface of the p-type light absorbing layer 3 facing the first p-electrode 2a is more preferably in direct contact with the Sn-based metal oxide of the first p-electrode 2a.

The metals contained in the oxide in the first p-electrode 2a may include, in addition to Sn, at least one metal selected from the group consisting of Zn, Al, Ga, In, Si, Ge, Ti, Cu, Sb, Nb, F, and Ta. These metals other than Sn are doped with tin oxide. For example, by increasing Sb, carriers increase, and the first p-electrode 2a and the p-type light absorbing layer 3 easily have a tunnel junction. Cu contained in the p-type light absorbing layer 3 may also be contained in the first p-electrode 2a. For these reasons, among the above metals, Cu, Sb, or Cu and Sb are preferable in addition to Sn as the metal contained in the first p-electrode 2a. Therefore, the metals of the oxide in the first p-electrode 2a is preferably: Sn and Sb; Sn and Cu; or Sn, Sb, and Cu. The first p-electrode 2a is preferably a transparent conductive oxide film (semiconductor conductive film) substantially not containing at least one metal selected from the group consisting of Zn, Al, Ga, In, Si, Ge, Ti, Cu, Sb, Nb, F, and Ta, other than Sn. In other words, the first p-electrode 2a may be a transparent conductive oxide film (semiconductor conductive film) in which no less than 92 atom % and no more than 100 atom % of the metals contained in the oxide is Sn, and no more than 8 atom % is at least one metal selected from the group consisting of Zn, Al, Ga, In, Si, Ge, Ti, Cu, Sb, Nb, F, and Ta.

It is preferable that no less than 90 atom % of the metals contained in the oxide of the first p-electrode 2a be Sn. When the concentration of Sn in the first p-electrode 2a is low, a Schottky barrier is easily formed with the p-type light absorbing layer 3 like ITO. From the same viewpoint, it is preferable that no less than 90 wt % of the first p-electrode 2a be an Sn-based metal oxide. From the same viewpoint, it is more preferable that no less than 92 atom % of the metals contained in the oxide of the first p-electrode 2a be Sn. From the same viewpoint, the concentration of Sn contained in the first p-electrode 2a is preferably no less than 29.5 atom % and no more than 33.5%. It is more preferable that no less than 92 atom % of the metals contained in the oxide of the first p-electrode 2a be Sn, and no more than 8 atom % be at least one metal selected from the group consisting of Zn, Al, Ga, In, Si, Ge, Ti, Cu, Sb, Nb, F, and Ta. It is more preferable that no less than 92 atom % of the metals contained in the oxide of the first p-electrode 2a be Sn, and no less than 0.1 atom % and no more than 8.0 atom % be Cu, Sb, or Cu and Sb.

The first p-electrode 2a is preferably thinner than the second p-electrode 2b because the first p-electrode 2a is preferably thin to reduce light absorption and reflection, and the second p-electrode 2b is preferably thick to reduce electric resistance. From the same viewpoint, the thickness of the first p-electrode 2a is preferably no less than 0.02 times and no more than 0.5 times of the thickness of the second p-electrode 2b. The thickness of the first p-electrode 2a is determined by cross-sectional observation with an electron microscope or with a step profiler, and is preferably no less than 10 nm and no more than 500 nm. When the first p-electrode 2a is too thin, the p-type light absorbing layer 3 easily comes into direct contact with the second p-electrode 2b and the third p-electrode 2c. When the first p-electrode 2a is too thick, the transmittance of the p-electrode 2 decreases, and the transmittance as a solar cell also decreases, which is not preferable. The above range is preferable from the viewpoint that the whole area of the surface of the first p-electrode 2a facing the p-type light absorbing layer 3 and the whole area of the surface of the p-type light absorbing layer 3 facing the first p-electrode 2a are in direct contact with each other. From the same viewpoint, it is more preferable that the thickness of the first p-electrode 2a be no less than 20 nm and no more than 300 nm.

The first p-electrode 2a is preferably deposited by, for example, sputtering after the second p-electrode 2b is formed on the substrate 1.

Because the resistivity of an Sn-based metal oxide is slightly higher than that of a metal film, an intermetallic compound film, or a transparent conductive oxide film such as Indium Tin Oxide (ITO), power generation loss due to a resistance component slightly occurs when the Sn-based metal oxide is used in a single electrode. Therefore, the power generation loss can be reduced by lowering the resistance of the entire p-electrode 2, because the second p-electrode 2b have low resistance by combining the first p-electrode 2a and the second p-electrode 2b.

Metals have lower resistance than transparent conductive oxides such as ITO, but metals and graphene do not have very high adhesion to the substrate 1. When the second p-electrode 2b is a layer such as a solid film, the whole area of the surface of the substrate 1 is in direct contact with the second p-electrode 2b, and thus the p-electrode 2 is easily peeled from the substrate 1. Therefore, it is preferable to use the p-electrode 2 of the embodiment in order to increase the peel strength between the substrate 1 and the p-electrode 2 while reducing the resistance of the p-electrode 2.

The peel strength can be measured by a peel test. Peel test is a test for quantifying and evaluating adhesion between a film and a substrate. There are several methods, and examples thereof include a cross-cut tape method in which an adhesive tape is attached to a thin film, and then the adhesive tape is pulled up to examine adhesion between the thin film and a substrate. In the cross-cut tape method, cuts are made first in an object with a cutter knife blade or the like, and for example a total of 100 squares are formed by 10 squares in length and width, with each square having a size of 5 mm×5 mm. Next, an adhesive tape is attached to the surface of the cut thin film, and the adhesive tape is sufficiently brought into close contact with the thin film. Finally, an end of the tape is held and kept at a right angle to the coating film surface, and the tape is instantaneously peeled off. Ease of peeling (difficulty of peeling) is evaluated on a scale according to the number of peeled squares.

The test sample used for the peel test is a sample in which the p-type light absorbing layer 3 is formed on the p-electrode or the solar cell. The sample in which the p-type light absorbing layer is formed on the p-electrode is subjected to a peel test by a cross-cut tape method with a tape attached to the p-type light absorbing layer 3. When the solar cell is used as a sample, a structure such as a cover glass that would be an obstacle in performing the peel test is removed with an acid or the like, and the peel test is performed on a member in which the surface of the n-electrode 5 is exposed. In addition to the p-type light absorbing layer, there may be an n-electrode or an p-layer. When there is a portion having a smaller peel strength at an interface of the upper layers or bulk than that of the inside of the p-electrode or the interface with which the p-electrode is in contact, the portion having the weak peel strength is peeled off in advance using a tape before the peel test.

The wiring of the second p-electrode 2b is preferably any one of graphene, metal, and a laminate of metal and graphene. The graphene of the second p-electrode 2b includes graphene grown from a metal wiring of the second p-electrode 2b.

The metal wiring used as the second p-electrode 2b is preferably a film of at least one metal selected from the group consisting of Cu, Al, Ag, Mo, W, and Ta. The metal wiring of the second p-electrode 2b also includes a form in which a plurality of metals made of different metals are laminated. The metal wiring of the second p-electrode 2b also includes an alloy wiring. A thin oxide film may be formed on the surface of the second p-electrode 2b, but there is almost no adverse effect on improvement of conductivity because the oxide film is thin.

When having a large area where the substrate 1 and the first p-electrode 2a are in contact with each other, the p-electrode 2 is hardly peeled from the substrate 1. The aperture ratio of the second p-electrode 2b, which is the ratio at which the second p-electrode 2b is not provided, is preferably no less than 90.00% and no more than 99.99%, because the area where the substrate 1 and the first p-electrode 2a are in contact with each other increases when the aperture ratio is high. When the aperture ratio of the second p-electrode 2b is less than 90.00%, the transmittance of the p-electrode 2 decreases, and the area where the first p-electrode 2a and the substrate 1 are in contact with each other decreases, which makes it difficult for the peel strength to improve. When the aperture ratio of the second p-electrode 2b is more than 99.99%, the second p-electrode 2b hardly exists, and the resistance of the p-electrode 2 hardly decreases. From the above viewpoint, the aperture ratio of the second p-electrode 2b is more preferably no less than 95.00% and no more than 99.95%. The aperture ratio is obtained by observing the p-electrode 2 from the substrate 1 side.

The shape of the wiring is preferably a line shape or a mesh shape. The wiring is electrically connected to a solar cell, a power converter, or the like outside the solar cell 100. When the second p-electrode 2b is not a wiring but a dot-like or divided conductor, the second p-electrode 2b does not form a power transmission path, which is not preferable. In either a line shape or a mesh shape, electricity generated by the solar cell 100 can efficiently flows to the outside through the wiring of the second p-electrode 2b.

Figure 3:
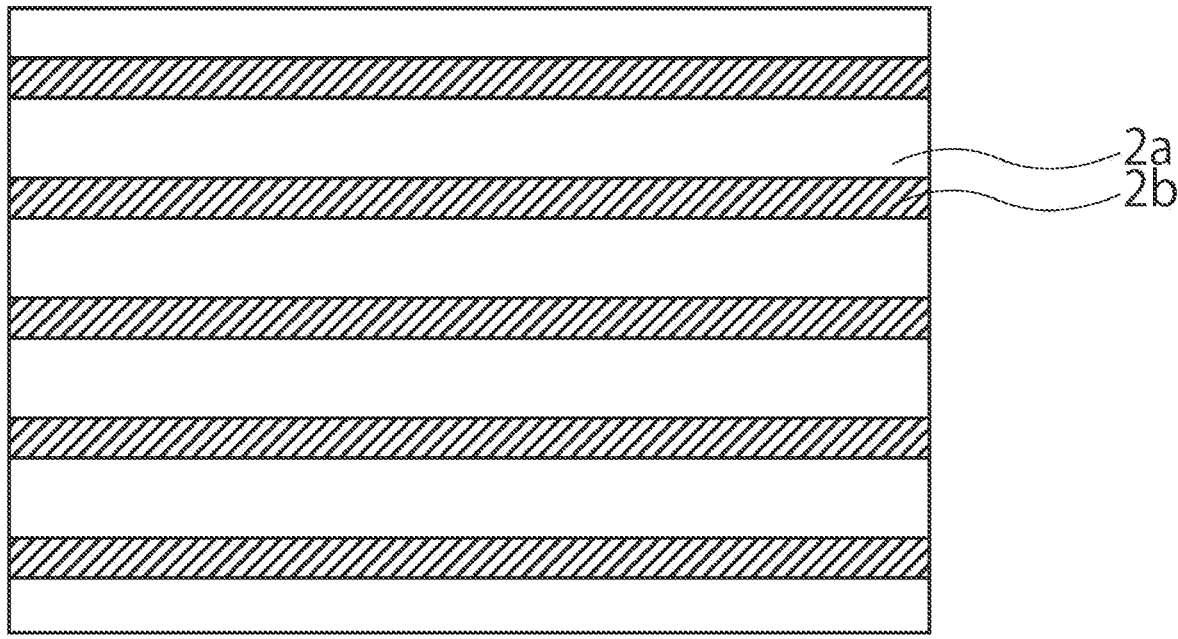
FIG. 3 is a schematic view of a second p-electrode according to an embodiment.
Figure 4:
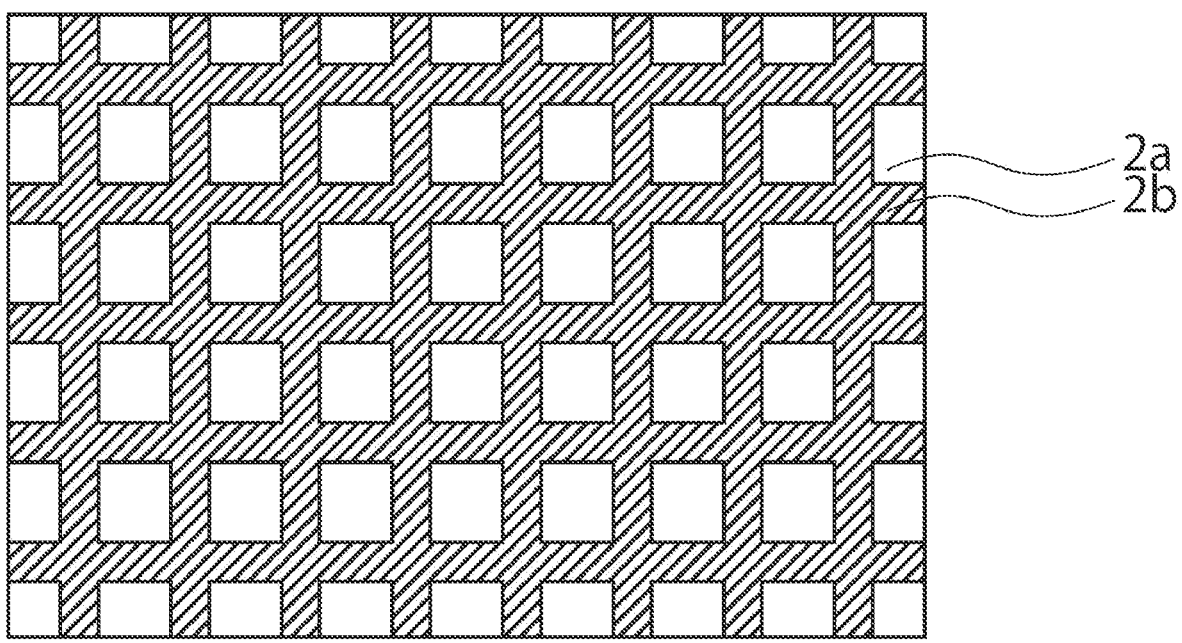
FIG. 4 is a schematic view of a second p-electrode according to an embodiment.
Figure 5:
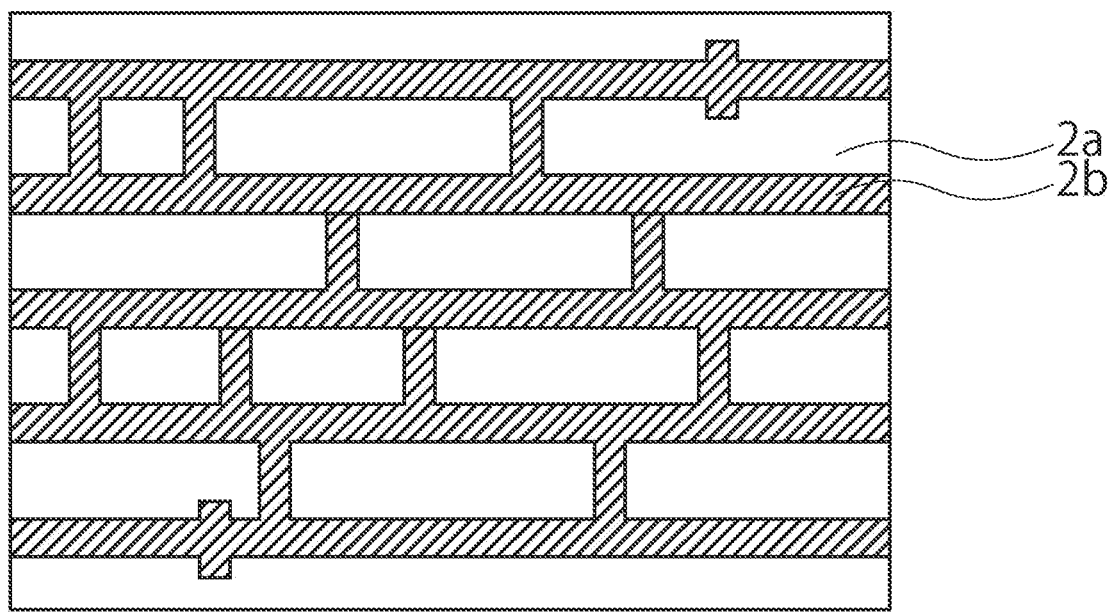
FIG. 5 is a schematic view of a second p-electrode according to an embodiment.

FIGS. 3, 4, and 5 are schematic views of the second p-electrode 2b. FIG. 3 illustrates the second p-electrode 2b having a line shape. The linear wiring is preferably consisting of a plurality of thin wires extending in parallel or substantially parallel (angle difference within ±3°).

FIG. 4 illustrates the second p-electrode 2b having a mesh shape. It is preferable that the mesh wiring be consisting of a plurality of thin wires extending in parallel or substantially parallel (angle difference within ±3°) and a plurality of thin wires extending in parallel or substantially parallel (angle difference within ±3°) and intersecting with (preferably orthogonal to) the plurality of thin wires extending in parallel or substantially parallel. By forming the mesh, the current can be dispersed. In addition, by forming the mesh, it is preferable that the area of the region sandwiched (surrounded) by the wirings can be made smaller than the area of the region sandwiched by the linear wirings, the degree of freedom in layout design of the second p-electrode 2b be increased, and the resistance of the p-electrode 2 be easily reduced.

FIG. 5 is a modification of the mesh wiring. In the mesh wiring illustrated in FIG. 5, the mesh has different positions and sizes. Even when a part is formed in a mesh shape, an effect of reducing resistance by forming a mesh wiring can be obtained. That is, the wiring may be any wiring arranged so as to satisfy the following preferable requirements of a pitch in a certain direction when the solar cell is viewed from above. The wirings arranged to intersect with the wirings arranged so as to satisfy the preferable requirements of the following pitch do not have to be regularly arranged.

In a case where the wiring is a mesh and the wiring includes a rectangular portion including a square, there are two types of pitches of narrower and wider wirings. When the aperture ratio of the second p-electrode 2b is A, the aperture ratio A is represented by the following formula, $A=(P1-W)\times(P2-W)/(P1\times P2)$, wherein the pitch of the narrower mesh wiring is P1, the pitch of the wider mesh wiring is P2, and the line width of the wirings is W. The upper limit of the aperture ratio is mainly determined by the narrower P1 and W. The average value of the pitch of the narrower mesh wiring P1 is preferably no less than 100 μm and no more than 10,000 μm. With the increasing average value of P1 larger than 10,000 μm, the effect of reducing the resistance by the second p-electrode 2b decreases. When the average value of P1 is less than 100 μm, the resistance of the p-electrode 2 decreases, but the light transmittance of the p-electrode 2 decreases, which is not preferable. From the same viewpoint, the pitch P1 of the narrower wiring is more preferably no less than 100 μm and no more than 5,000 μm, and further preferably no less than 100 μm and no more than 2,000 μm. The pitch of the wiring is an average value of the maximum value and the minimum value of the center-to-center distances between adjacent thin wires that are parallel or substantially parallel. Note that, in a case of the mesh wiring, it is assumed that thin wires extending in a first direction and a second direction intersect to form the mesh wiring, and a pitch of the thin wires in the first direction and a pitch of the thin wires in the second direction are obtained by dividing the mesh wiring into the thin wires in the first direction and the thin wires in the second direction. Then, a smaller average value of the pitches is defined as a pitch P1 of the narrower mesh wiring, and a larger average value of the pitches is defined as a pitch P2 of the wider mesh wiring.

The average value of the pitches of the linear wiring is also preferably no less than 100 μm and no more than 10,000 μm from the same viewpoint as described above. From the same viewpoint, the average value of the pitch of the linear wiring is more preferably no less than 100 μm and no more than 5,000 μm, and further preferably no less than 100 μm and no more than 2,000 μm.

Note that the pitch is a center-to-center distance of the wirings sandwiching the opening portion which is a non-wiring region.

The line width of the wiring is preferably no less than 0.1 μm and no more than 25 μm. When the line width of the wiring is large, the resistance of the p-electrode 2 reduces, but it is not preferable that the line width of the wiring be too large in consideration of the transmittance of the p-electrode 2. A too small line width of the wiring is not preferable from the viewpoint of a decrease in current capacity and reliability of the wiring. A more preferable line width of the wiring is no less than 0.5 μm and no more than 10 μm. When the variation in the line width of the wiring is large, a region having a high transmittance of the p-electrode 2 and a region having a low transmittance exist, and in a case where a solar cell that generates power with light transmitted through the solar cell 100 is provided, it is not preferable that the variation in the amount of received light increase depending on the location, and the power generation amount be partially reduced.

The pitch P1 of the narrower mesh wiring and the line width W of the wiring preferably satisfy 0.00001≤W/P1≤0.1.

The pitch P0 of the linear wiring and the line width W of the wiring preferably satisfy 0.00001≤W/P0≤0.1.

When the second p-electrode 2b is provided only at unbalanced positions, the resistance partially increases as compared with the case where the position of the second p-electrode 2b is balanced. Therefore, the maximum value of the opening area of the opening of the second p-electrode 2b is preferably no less than one time and no more than five times of the minimum value of the opening area of the opening of the second p-electrode 2b.

The thickness of the second p-electrode 2b is determined by cross-sectional observation with an electron microscope or with a step profiler. The thickness (height of wiring) of the second p-electrode 2b is preferably larger than that of the first p-electrode 2a. The thickness of the second p-electrode 2b is preferably no more than 2 μm for example. When the thickness of the second p-electrode 2b is too thin, the resistance of the p-electrode 2 is difficult to decrease. Thus, the thickness of the second p-electrode 2b is preferably no less than 200 nm.

For example, the second p-electrode 2b can be produced by forming, on a substrate 1, a resist processed in accordance with the wiring shape of the second electrode 2b, depositing the metal that forms the second p-electrode 2b by sputtering or the like, and removing the resist. The second p-electrode 2b can also be produced for example by depositing the metal by sputtering or the like and then processing the metal into a wiring shape. When graphene is used for the second p-electrode 2b, the second p-electrode 2b can be produced in the same manner as described above, or the second p-electrode 2b can be produced by transferring graphene processed into a wiring shape onto the substrate 1.

It is preferable that no less than 60 wt % of the third p-electrode 2c be made of an In-based metal oxide (semiconductor conductive film), and it is more preferable that the third p-electrode 2c be made of an In-based metal oxide. No less than 60 atom % and no more than 98 atom % of the metals contained in the oxide of the third p-electrode 2c is preferably In, and no less than 70 atom % and no more than 95 atom % is preferably In. Among the metals contained in the In-based metal oxide of the third p-electrode 2c, no less than 2 atom % and no more than 40 atom % is preferably at least one metal selected from the group consisting of Sn, Sb, Ga, Ti, and Zn. The total concentration of Sn and Sb among the metals contained in the third p-electrode 2c is preferably no more than 35 atom %.

The thickness of the third p-electrode 2c is preferably no less than 5 nm and no more than 100 nm. When the thickness of the third p-electrode 2c is too thin, the third p-electrode 2c becomes not a continuous film but an island-like film, and thus is easily peeled from the first p-electrode 2a and/or the second p-electrode 2b, which is not preferable. When the thickness of the third p-electrode 2c is too thick, resistance between the first p-electrode 2a and the second p-electrode 2b via the third p-electrode 2c increases, which is not preferable. In consideration of resistance, the thickness of the third p-electrode 2c is preferably smaller than the thickness of the second p-electrode 2b. Therefore, the thickness of the third p-electrode 2c is more preferably no less than 5 nm and no more than 30 nm.

Figure 6:
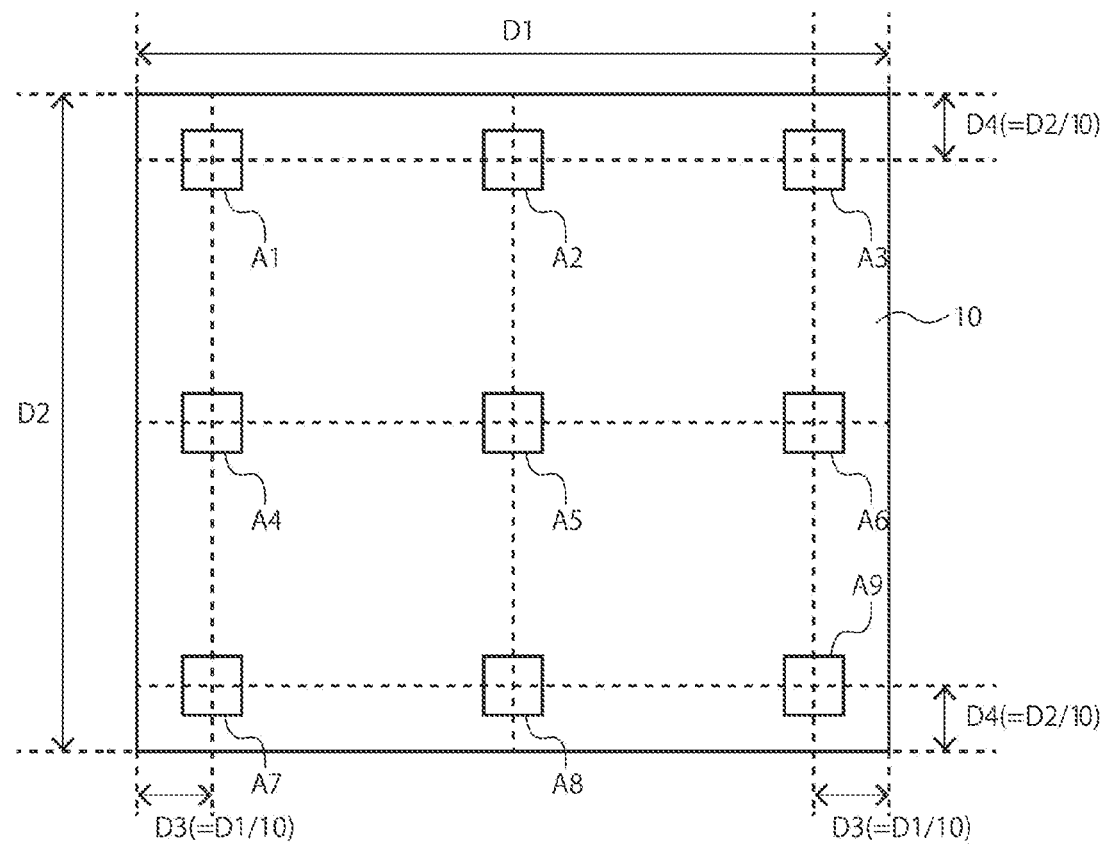
FIG. 6 is diagram illustrating analysis spots of a solar cell according to an embodiment.

The elemental composition in the first p-electrode 2a, the second p-electrode 2b, the third p-electrode 2c, and the fourth p-electrode 2e described later can be determined as follows. First, the composition distribution of the metal elements in the cross section of the p-electrode 2 is determined by a scanning electron microscope with an energy dispersive X-ray spectrometer (Scanning Electron Microscope/Energy Dispersive X-ray Spectroscope; SEM-EDX). FIG. 6 shows the analysis positions. The surface of FIG. 6 is a surface of the solar cell 100 viewed from the substrate 1 side, and is a rectangular region in which the p-electrode 2 is formed on the whole area. The positions of the nine analysis spots (A1 to A9) shown in FIG. 6 are analyzed in the depth direction of the solar cell 100 (direction from the p-electrode 2 toward the n-type layer 4). As shown in FIG. 6, when the length of the solar cell 100 is D1 and the width of the solar cell 100 is D2 (D1≥D2), virtual lines are drawn at a distance of D3 (=D1/10) inward from the two sides facing each other in the width direction of the solar cell 100, and at a distance of D4 (=D2/10) inward from the two sides facing each other in the length direction of the solar cell 100. More virtual lines parallel to the width direction passing through the center of the solar cell 100 and virtual lines parallel to the length direction passing through the center of the solar cell 100 are further drawn. The analysis spots (A1 to A9) are the regions defined by the nine intersections of the virtual lines, the intersections being positioned at the centers of the regions, Next, the chemical bonding state of the metal elements is determined by X-ray Photoelectron Spectroscopy (XPS), and the ratio of the metal, the alloy and the oxide (compound) is determined. The analysis positions are the same analysis spots A1 to A9 as in SEM-EDX. Analysis is performed at intervals of 10 nm in the thickness direction of the p-electrode 2, and the ratio of metal, alloy, and oxide (compound) in each depth range (D1 to Dn) is determined from the average value in the same manner as in SEM-EDX. The interval for the analysis can be appropriately changed according to the thicknesses of the first p-electrode 2a and the thickness of the second p-electrode 2b obtained from SEM-EDX. In this way, the ratio of the metal elements in each depth range and the state of the metals (types of metals, alloys, and compounds and the ratio thereof) are obtained by associating the analysis result of SEM-EDX with the analysis result of XPS. SEM-EDX and XPS analyze separate samples.

The p-type light absorbing layer 3 is a p-type semiconductor layer. The p-type light absorbing layer 3 is in direct contact with the surface of the first p-electrode 2a opposite to the surface on the second p-electrode 2b side. The p-type light absorbing layer 3 is disposed between the first p-electrode 2a and the n-type layer 4. The p-type light absorbing layer 3 is a semiconductor layer of a Cu-based metal oxide. The Cu-based metal oxide is cuprous oxide or a composite oxide of cuprous oxide. The Cu-based metal oxide contains Cu in an amount of no less than 60.0 atom % and no more than 67.0 atom % and O (oxygen) in an amount of no less than 32.5 atom % and no more than 34.0 atom %. The composite oxide of cuprous oxide contains a metal other than Cu. The metal contained in the composite oxide of cuprous oxide is, in addition to Cu, at least one metal selected from the group consisting of Sn, Sb, Ag, Li, Na, K, Cs, Rb, Al, Ga, In, Zn, Mg, and Ca. When at least one metal selected from the group consisting of Ag, Li, Na, K, Cs, Rb, Al, Ga, In, Zn, Mg, and Ca is contained in addition to Cu, the band gap of the p-type light absorbing layer 3 can be adjusted. The band gap of the p-type light absorbing layer 3 is preferably no less than 2.0 eV and no more than 2.2 eV. When the band gap is in such a range, sunlight can be efficiently used in both the top cell and the bottom cell in a multi-junction solar cell in which the solar cell using Si for the light absorbing layer is used as the bottom cell and the solar cell of the embodiment is used as the top cell. The p-type light absorbing layer 3 may further contain Sn or Sb. Sn or Sb in the p-type light absorbing layer 3 may be Sn or Sb added to the light absorbing layer 2 or may be Sn or Sb derived from the p-electrode 2. The p-type light absorbing layer 3 is a layer of an oxide represented by $Cu_aM_bO_c$. M is at least one metal selected from the group consisting of Sn, Sb, Ag, Li, Na, K, Cs, Rb, Al, Ga, In, Zn, Mg, and Ca. It is preferable that a, b, and c satisfy $1.80 \leq a \leq 2.01$, $0.00 \leq b \leq 0.20$, and $0.98 \leq c \leq 1.02$. The composition ratio of the p-type light absorbing layer 3 is the composition ratio of the entire p-type light absorbing layer 3. In addition, it is preferable that the compound composition ratio of the p-type light absorbing layer 3 be satisfied in the p-type light absorbing layer 3 as a whole. When the concentrations of Sn and Sb in the p-type light absorbing layer are high, defects increase, and carrier recombination increases. Therefore, the total volume concentration of Sb and Sn in the p-type light absorbing layer 3 is preferably no more than $1.5 \times 10^{19}$ atoms/cm$^3$. The composition of the p-type light absorbing layer 3 and the n-type layer 4 is determined by Secondary Ion Mass Spectrometry (SIMS). As the analysis position, an average value of the values obtained in the same manner as in the p-electrode 2 can be used as the composition of each layer.

The thickness of the p-type light absorbing layer 3 is determined by cross-sectional observation with an electron microscope or with a step profiler, and is preferably no less than 1,000 nm and no more than 10,000 nm.

The p-type light absorbing layer 3 is preferably deposited by sputtering, for example.

The n-type layer 4 is an n-type semiconductor layer. The n-type layer 4 is disposed between the p-type light absorbing layer 3 and the n-electrode 5. The n-type layer 4 is in direct contact with the surface of the p-type light absorbing layer 3 opposite to the surface in contact with the first p-electrode 2a. The n-type layer 4 is preferably a layer including an oxide layer or a sulfide layer. More specifically, the oxide layer used for the n-type layer 4 is preferably a layer selected from the group consisting of $Zn_{(1-x)}A_xO_y$ (A=Si, Ge, Sn, $0 \leq x \leq 0.6$, $0.9 \leq y \leq 1.1$), $Cu_{(2-x)}M_xO$ (M=Mn, Mg, Ca, Zn, Sr, Ba, $0 \leq x \leq 0.3$), $A_{(2-x-y)}Al_yGa_xO_3$ (A=Si, Ge, Sn, $1.3 \leq x \leq 2$, $0 \leq y \leq 0.7$, x+y$\leq$2), and $Al_{(2-x)}Ga_xO_3$ ($1.3 \leq x \leq 2$). The sulfide layer used for the n-type layer is preferably a layer containing at least one sulfide selected from the group consisting of $Zn_xIn_{(2-2x)}S_{(3-2x)}$ ($1 \leq x \leq 1.5$), ZnS, and $In_xGa_{(1-x)}S$ ($0 \leq x \leq 1$). The n layer may have a laminated structure of the oxide layers or the sulfide layers.

The thickness of the n-type layer 4 is preferably no less than 5 nm and no more than 100 nm. When the thickness of the n-type layer 4 is no more than 5 nm, a leakage current is generated when the coverage of the n-type layer 4 is poor, which is not preferable. When the thickness of the n-type layer 4 exceeds 100 nm, the transmittance decreases and the short-circuit current decreases, which is not preferable. Therefore, the thickness of the n-type layer 4 is more preferably no less than 10 nm and no more than 50 nm. The surface roughness of the n-type layer 4 is preferably no more than 5 nm to realize a film with good coverage.

The n-type layer 4 is preferably deposited by sputtering, atomic layer deposition (ALD), or the like, for example.

The n-electrode 5 is an electrode on the n-type layer 4 side having optical transparency to visible light. The n-type layer 4 is sandwiched between the n-electrode 5 and the p-type light absorbing layer 3. An intermediate layer (not illustrated) can be provided between the n-type layer 4 and the n-electrode 5. A transparent conductive oxide film (semiconductor conductive film) is preferably used for the n-electrode 5. The transparent conductive oxide film used for the n-electrode 5 is preferably at least one transparent conductive film selected from the group consisting of indium tin oxide, aluminum-doped zinc oxide, boron-doped zinc oxide, gallium-doped zinc oxide, indium-doped zinc oxide, aluminum gallium oxide, titanium-doped indium oxide, indium gallium zinc oxide, and hydrogen-doped indium oxide.

The thickness of the n-electrode 5 is determined by cross-sectional observation with an electron microscope or with a step profiler, and typically no less than 1 nm and no more than 2 μm, though not limited to particular values.

The n-electrode 5 is preferably deposited by sputtering, for example.

Second Embodiment

A second embodiment relates to a solar cell. The solar cell of the second embodiment is a modification of the solar cell of the first embodiment. As shown in the cross-sectional view of the solar cell 101 of the embodiment of FIG. 7, the second p-electrode 2b is embedded in the substrate 1. Examples of the solar cell 101 of the second embodiment include a form in which the second p-electrode 2b is embedded in the substrate 1 and the third p-electrode 2c is not embedded in the substrate 1, and a form in which the second p-electrode 2b and the third p-electrode 2c are embedded in the substrate 1. Furthermore, as illustrated in the cross-sectional view of the solar cell 102 in FIG. 8, the first p-electrode 2a may include a metal layer 2d having a thickness of no more than 10 nm, and the third p-electrode 2c may be embedded in the substrate 1. When the first p-electrode 2a includes the metal layer 2d having a thickness of no more than 10 nm, the third p-electrode 2c may be embedded in the substrate 1 as described above, or the third p-electrode 2c may not be embedded.

Although the resistance of the oxide of the first p-electrode 2a is high, the resistance of the entire first p-electrode 2a can be reduced by adding the metal layer 2d. Therefore, when the wiring pitch of the second p-electrode 2b is large, the resistance can be reduced by adding the metal layer 2d to make the entire p-electrode 2 resistant.

From the viewpoint of the contact between the p-type light absorbing layer 3 and the p-electrode 2, the metal layer 2d is not exposed on the surface of the first p-electrode 2a on the p-type light absorbing layer 3 side. The metal layer 2d may or may not be in direct contact with the second p-electrode 2b. The metal layer 2d preferably spreads in a planar shape in a direction perpendicular to the lamination direction of the p-electrode 2 and the p-type light absorbing layer 3. The metal layer 2d is preferably a thin layer of Ag, for example. The metal layer 2d may be an Ag film or a layer consisting of Ag nanowires, for example. It is preferable that the resistance of the first p-electrode 2a be reduced by including the metal layer 2d in the first p-electrode 2a. Because the metal layer 2d is thin and thus it has little influence on transparency, the metal layer 2d is suitable for an electrode of a transmissive solar cell as in the embodiment. When the transmittance of the solar cell 101 of the embodiment decreases, the influence on the power generation of the solar cell 101 of the embodiment can be avoided. However, in the case of a multi-junction solar cell, in a bottom cell that generates power with light transmitted through the solar cell of the embodiment, the power generation amount of the bottom cell decreases if the wavelength in the absorption band is absorbed by the solar cell 101 of the embodiment. Therefore, the transmissiveness of the solar cell 101 of the embodiment is an important characteristic. From the above viewpoint, the thickness of the metal layer 2d is more preferably no less than 1 nm and no more than 7 nm. This is because when the thickness of the metal layer 2d is less than 1 nm, it is difficult to reduce the resistance of the first p-electrode 2a.

Figure 7:
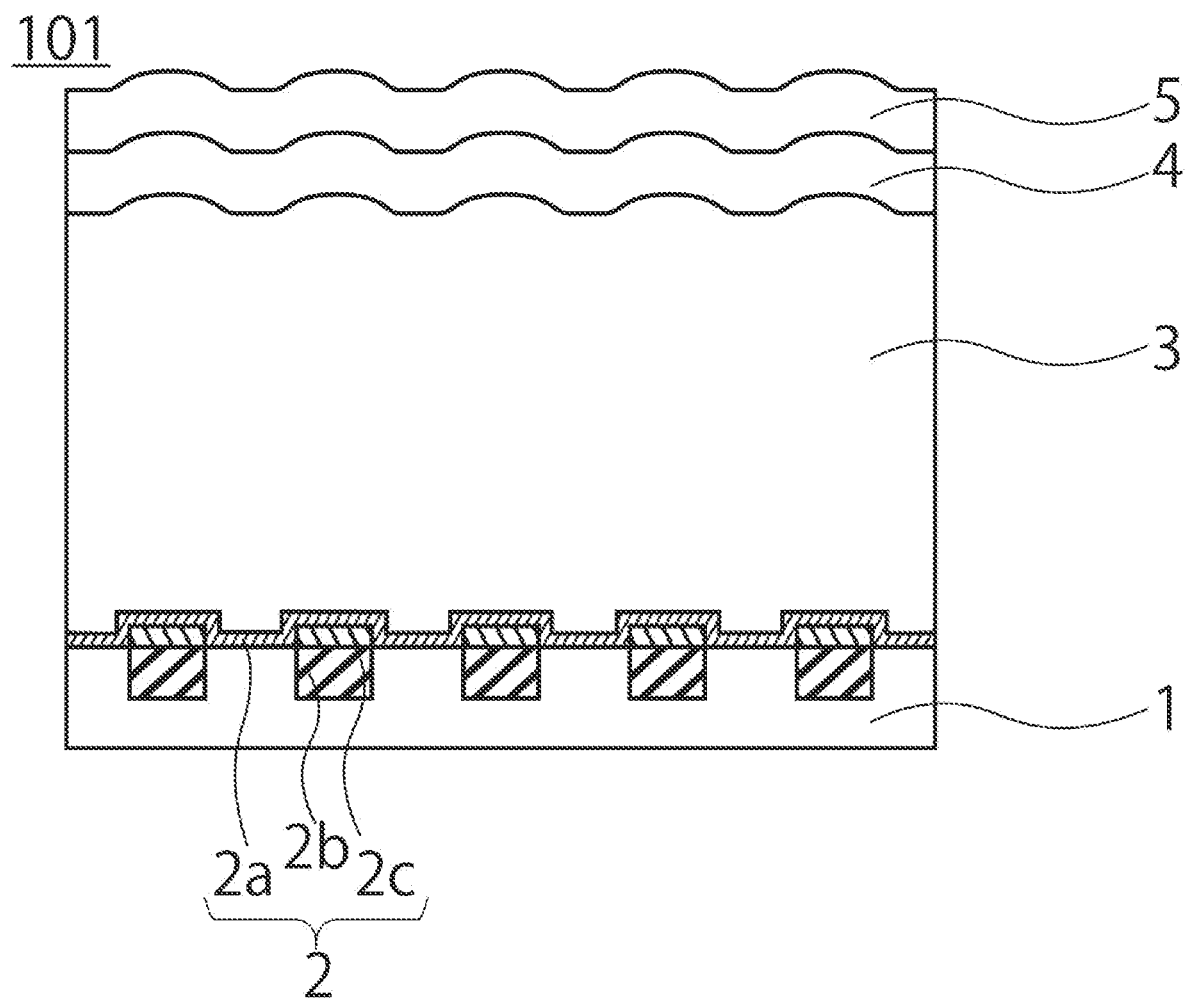
FIG. 7 is a cross-sectional view of a solar cell of an embodiment.

As shown in the solar cell 101 of FIG. 7, a groove may be formed on the first p-electrode 2a side of the substrate 1, and a second p-electrode 2b as a wiring may be provided in the groove. The groove of the solar cell 101 and the second p-electrode 2b in FIG. 7 are obtained by, for example, processing by a damascene method. That is, both the first p-electrode 2a and the second p-electrode 2b are exposed on the surface of the p-electrode 2 opposite to the p-type light absorbing layer 3 side.

Figure 8:
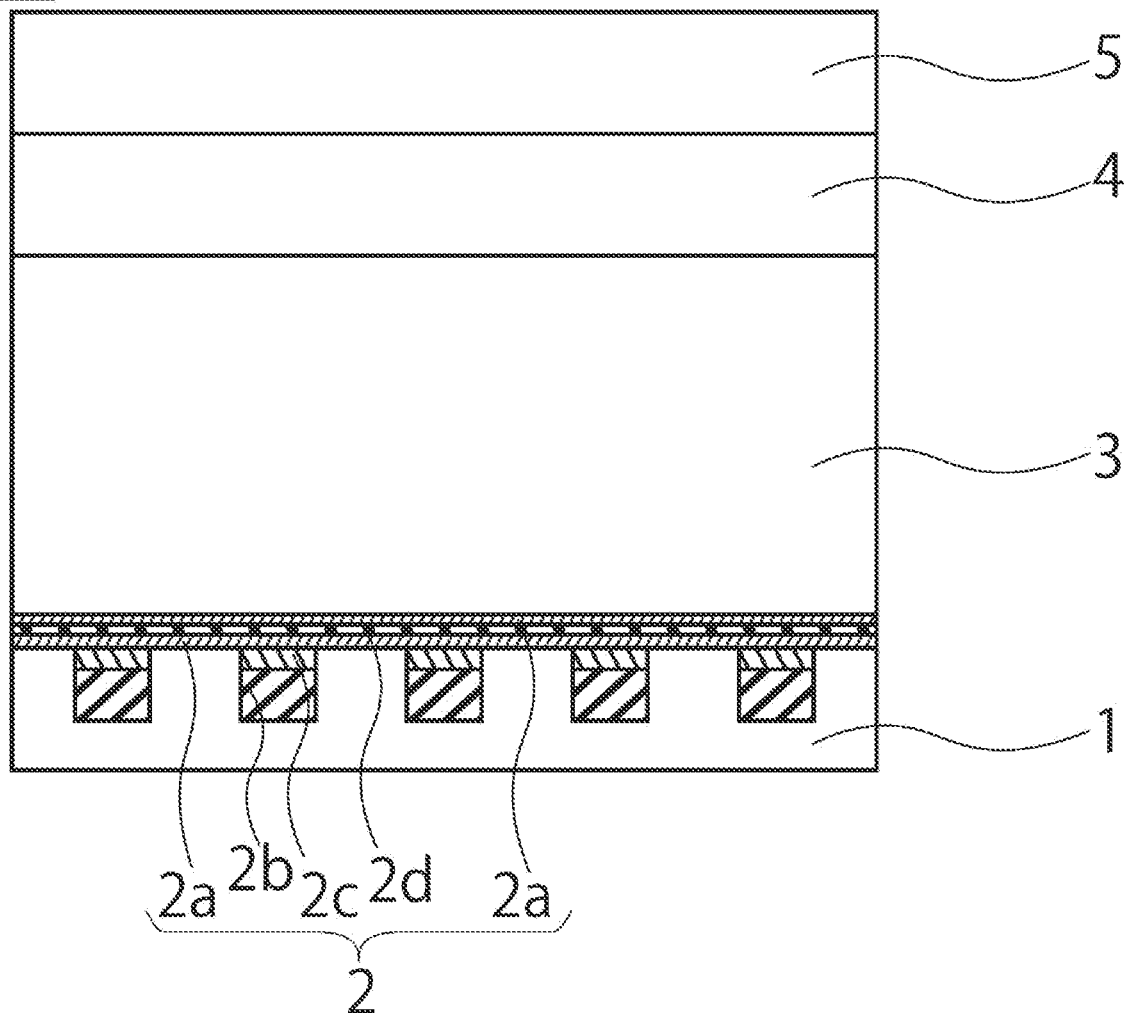
FIG. 8 is a cross-sectional view of a solar cell of an embodiment.

The surface of the p-electrode 2 on the substrate 1 side or the surface of the n-type layer 4 or the like may be a flat surface (including a substantially flat surface) as in the solar cell 101 of FIG. 8, or may be a non-flat surface as in the solar cell 100 of FIG. 1. Note that the solar cell 100 of FIG. 1 can also be made into a solar cell having a flat (including substantially flat) layer except for the p-electrode 2 and the surface of the p-type light absorbing layer 3 on the p-electrode 2 side as shown in FIG. 8 by flattening or the like. When a part of the p-electrode 2 is embedded in the substrate 1, the thickness of the substrate 1 is equal to or larger than the thickness of the embedded p-electrode 2. That is, a part of the p-electrode 2 is embedded in a gap penetrating the substrate 1 or a gap (groove) not penetrating the substrate 1. When a part of the p-electrode 2 is embedded in the substrate 1, a part or all of the p-electrode 2 except the first p-electrode 2a or/and a part of the first p-electrode 2a are embedded.

Third Embodiment

Figure 9:
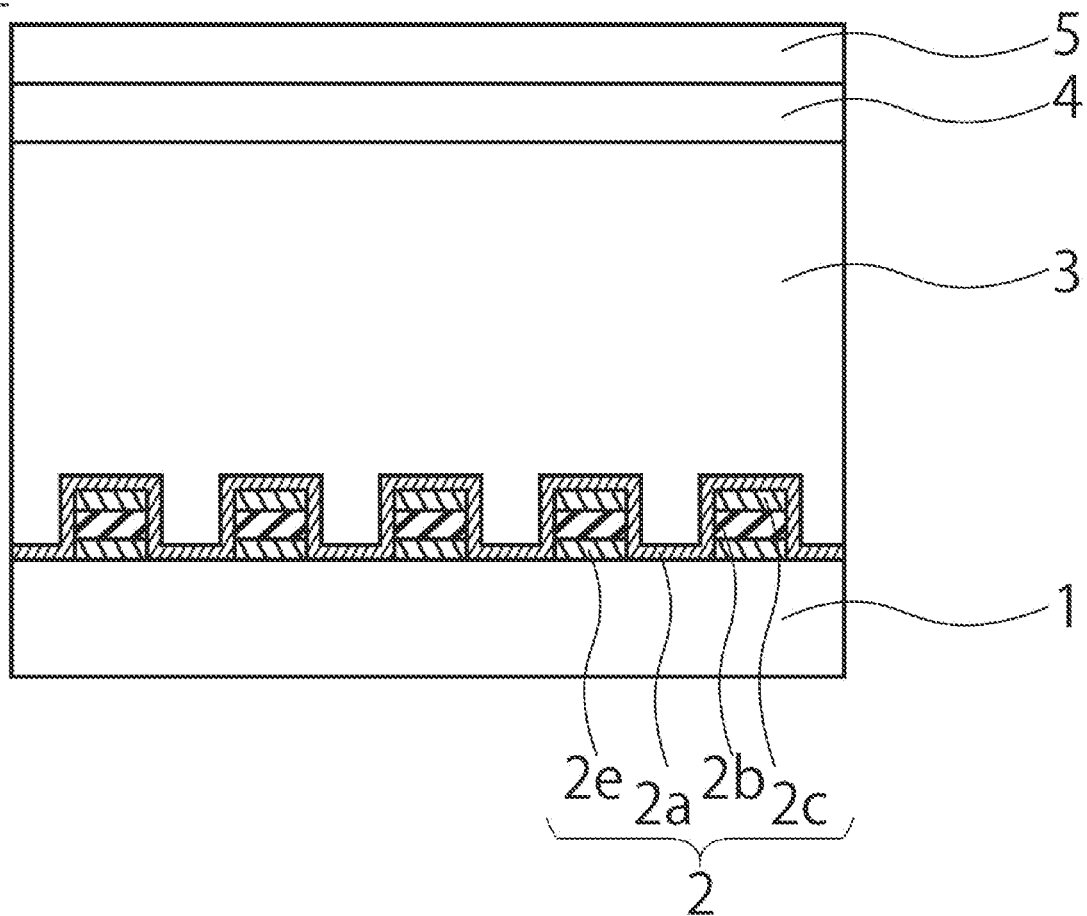
FIG. 9 is a cross-sectional view of a solar cell of an embodiment.

A third embodiment relates to a solar cell. The solar cell of the second embodiment is a modification of the solar cell of the first embodiment. As shown in the cross-sectional view of the solar cell 102 of the embodiment of FIG. 9, a fourth p-electrode 2e is further provided between the substrate 1 and the second p-electrode 2b. The second p-electrode 2b is sandwiched between the third p-electrode 2c and the fourth p-electrode 2e, and they form a laminate having a three-layer structure.

Similarly to the third p-electrode 2c, the fourth p-electrode 2e contains an In-based metal oxide (semiconductor conductive film). The fourth p-electrode 2e functions as an adhesive layer between the substrate 1 and the second p-electrode 2b, and the p-electrode 2 are hardly peeled from the substrate 1. The fourth p-electrode 2e may also be adopted in a form in which the second p-electrode 2b is embedded in the substrate 1 as illustrated in FIG. 7 or 8 In addition, the second p-electrode 2b may have a four-layer structure in which a metal and graphene are laminated and sandwiched between the third p-electrode 2c and the fourth p-electrode 2e provided on the upper side and the lower side of the laminate.

For the fourth p-electrode 2e, an In-based metal oxide is used. No less than 60 wt % of the fourth p-electrode 2e is preferably consisting of an In-based metal oxide, and the fourth p-electrode 2e is more preferably consisting of an In-based metal oxide. No less than 60 atom % and no more than 98 atom % of the metals contained in the fourth p-electrode 2e is preferably In, and no less than 70 atom % and no more than 95 atom % is preferably In. Among the metals contained in the In-based metal oxide of the fourth p-electrode 2e, no less than 2 atom % and no more than 40 atom % is preferably at least one metal selected from the group consisting of Sn, Sb, Ga, Ti, and Zn. The total concentration of Sn and Sb among the metals contained in the fourth p-electrode 2e is preferably no more than 35 atom %.

The thickness of the fourth p-electrode 2e is preferably no less than 5 nm and no more than 100 nm. When the thickness of the fourth p-electrode 2e is too small, the fourth p-electrode 2e are easily peeled from the substrate 1 and/or the second p-electrode 2b, which is not preferable. When the thickness of the fourth p-electrode 2e is too large, the thickness of the solar cell 100 becomes large, which is not preferable. The thickness of the fourth p-electrode 2e is more preferably no less than 5 nm and no more than 30 nm.

Fourth Embodiment

Figure 10:
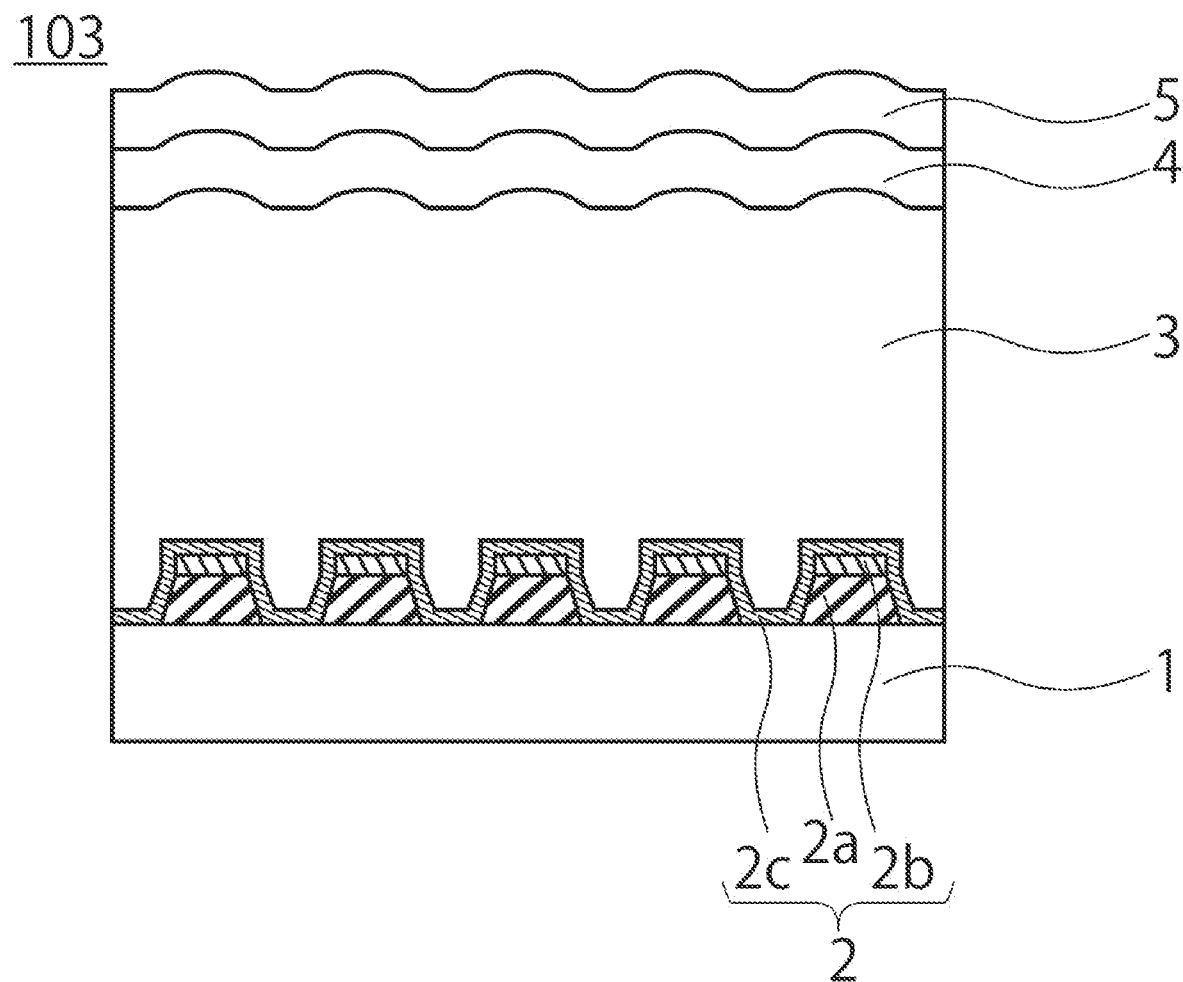
FIG. 10 is a cross-sectional view of a solar cell of an embodiment.

A fourth embodiment relates to a solar cell. The solar cell of the fourth embodiment is a modification of the solar cell of the first embodiment. As shown in the cross-sectional view of the solar cell 103 of the embodiment of FIG. 10, the cross section of the second p-electrode 2b is trapezoidal. The cross-sectional shape of the second p-electrode 2b is not particularly limited, and may be a rectangle or a trapezoid for example. When the cross section of the second p-electrode 2b is not rectangular, the widest portion is defined as the line width of the wiring of the second electrode 2b. Even when the cross section of the second p-electrode 2b is trapezoidal, the third p-electrode 2c is not provided on the side surfaces of the second p-electrode 2b. The cross-sectional shape of the wiring is not limited to rectangles, and a trapezoid or the like can be adopted.

Fifth Embodiment

Figure 11:
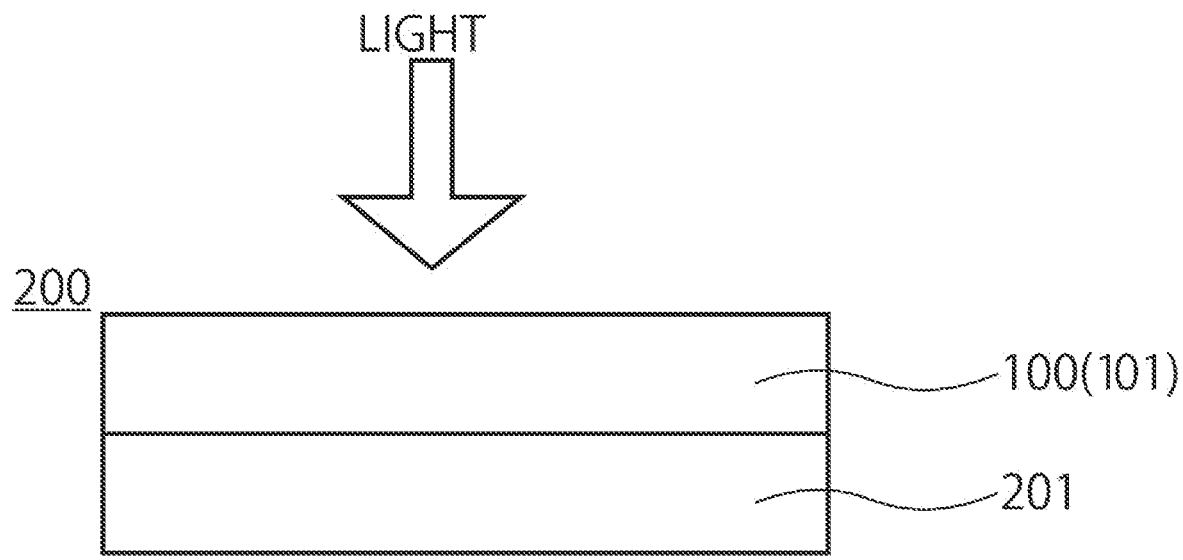
FIG. 11 is a cross-sectional view of a multi-junction solar cell of an embodiment.

A fifth embodiment relates to a multi-junction solar cell. FIG. 11 illustrates a conceptual sectional diagram of a multi-junction solar cell according to the fifth embodiment. The multi-junction solar cell 200 of FIG. 11 includes the solar cell (first solar cell) 100 (101) of the first embodiment on the light incident side and a second solar cell 201. The band gap of the photoelectric conversion layer of the second solar cell 201 is smaller than the band gap of the light absorbing layer 3 of the solar cell 100 according to the first embodiment. Incidentally, the multi-junction solar cell according to the embodiment includes a solar cell in which three or more solar cells are joined. Incidentally, in the fifth embodiment, the solar cell 101-104 of the second embodiment to the fourth embodiment can be used instead of the solar cell 100 of the first embodiment.

The band gap of the p-type light absorbing layer 3 of the first solar cell 100 according to the first embodiment is about from 2.0 eV-2.2 eV, and thus the band gap of the light absorbing layer of the second solar cell 201 is preferably 1.0 eV or more and 1.6 eV or less. The light absorbing layer of the second solar cell is preferably selected from the group consisting of any one or more compound semiconductor layers among CIGS-based having a high In content and CdTe-based compound semiconductor layers, crystalline silicon and perovskite type compound.

Sixth Embodiment

Figure 12:
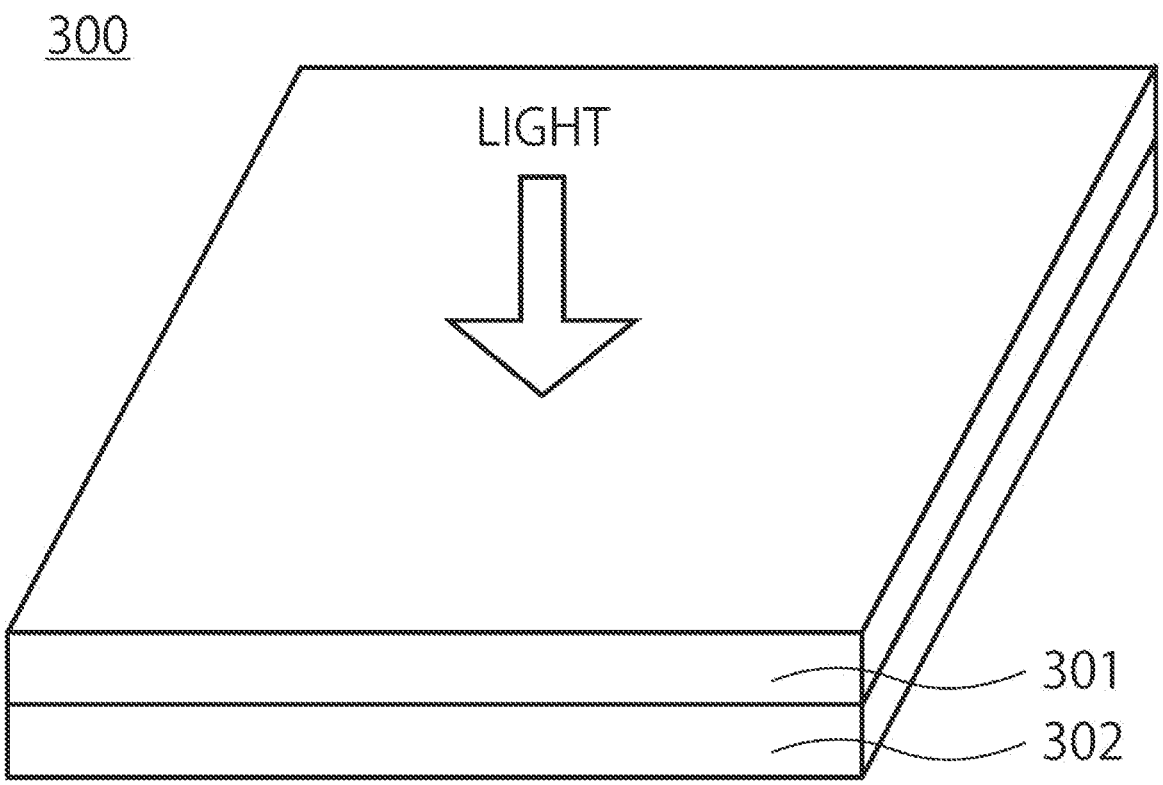
FIG. 12 is a perspective view of a solar cell module of an embodiment.

A sixth embodiment relates to a solar cell module. FIG. 12 illustrates a perspective diagram of a solar cell module 300 according to the sixth embodiment. The solar cell module 300 in FIG. 12 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 13:
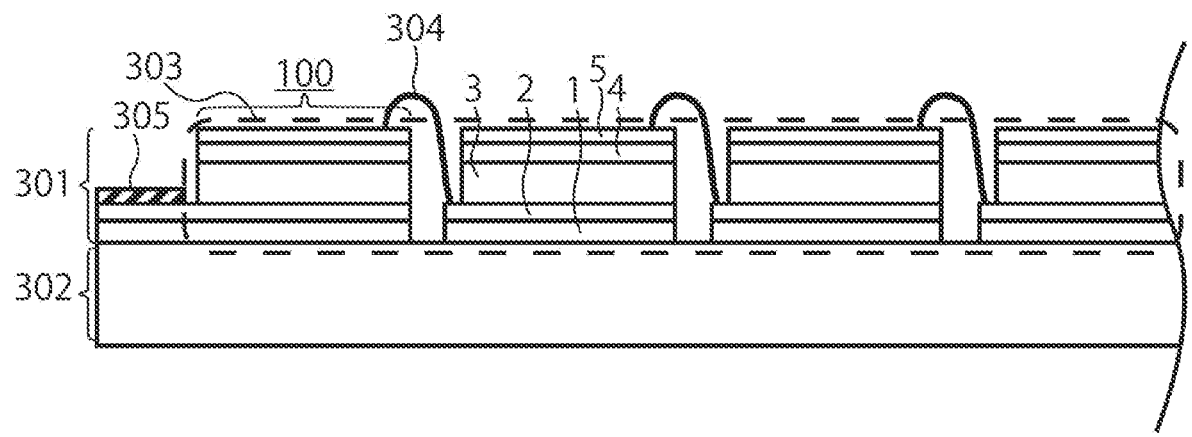
FIG. 13 is a cross-sectional view of a solar cell module of an embodiment.

FIG. 13 illustrates a sectional diagram of the solar cell module 300. In FIG. 13, the structure of the first solar cell module 301 is illustrated in detail but the structure of the second solar cell module 302 is not illustrated. In the second solar cell module 302, the structure of the solar cell module is appropriately selected depending on the light absorbing layer of the solar cell to be used. In the solar cell module in FIG. 13, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Similar to the solar cell 100 of the first embodiment, the solar cell 100 of the sixth embodiment includes the substrate 1, the p-electrode 2, the p-type light absorbing layer 3, the n-type layer 4, and the n-electrode 5. Both ends of the solar cell 100 in the submodule 303 are connected to the busbar 305. The busbar 305 is preferably configured to electrically connect a plurality of submodules 303 in parallel or in series and adjust the output voltage with the second solar cell module 302. Incidentally, the connection system of the solar cell 100 shown in the sixth embodiment is an example. The solar cell module can be configured by other connection systems.

Seventh Embodiment

Figure 14:
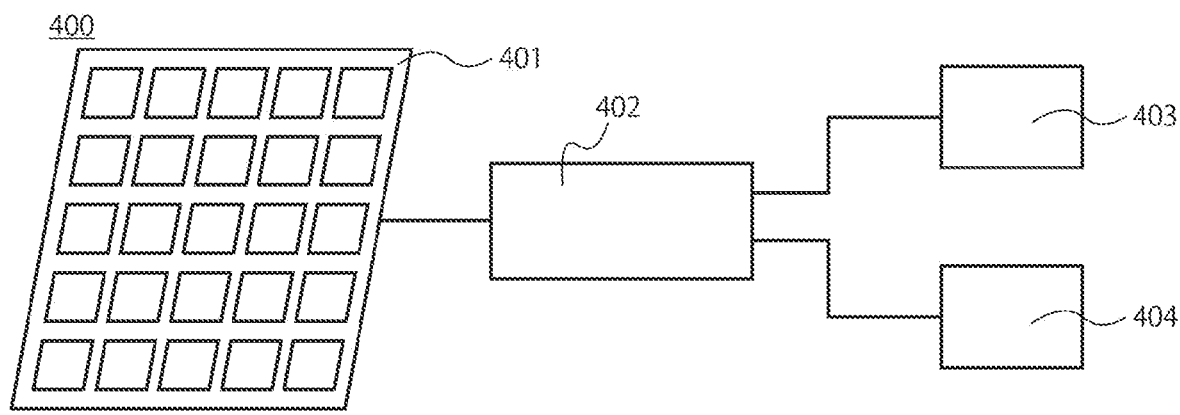
FIG. 14 is a structural view of a photovoltaic power generation system of an embodiment.

A Seventh embodiment relates to a solar photovoltaic power generation system. The solar cell module according to the sixth embodiment can be used as a generator which generates electric power in the solar photovoltaic power generation system according to the seventh embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 14 illustrates a conceptual diagram of a solar photovoltaic power generation system 400 according to the embodiment. The solar photovoltaic power generation system in FIG. 14 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module.

Figure 15:
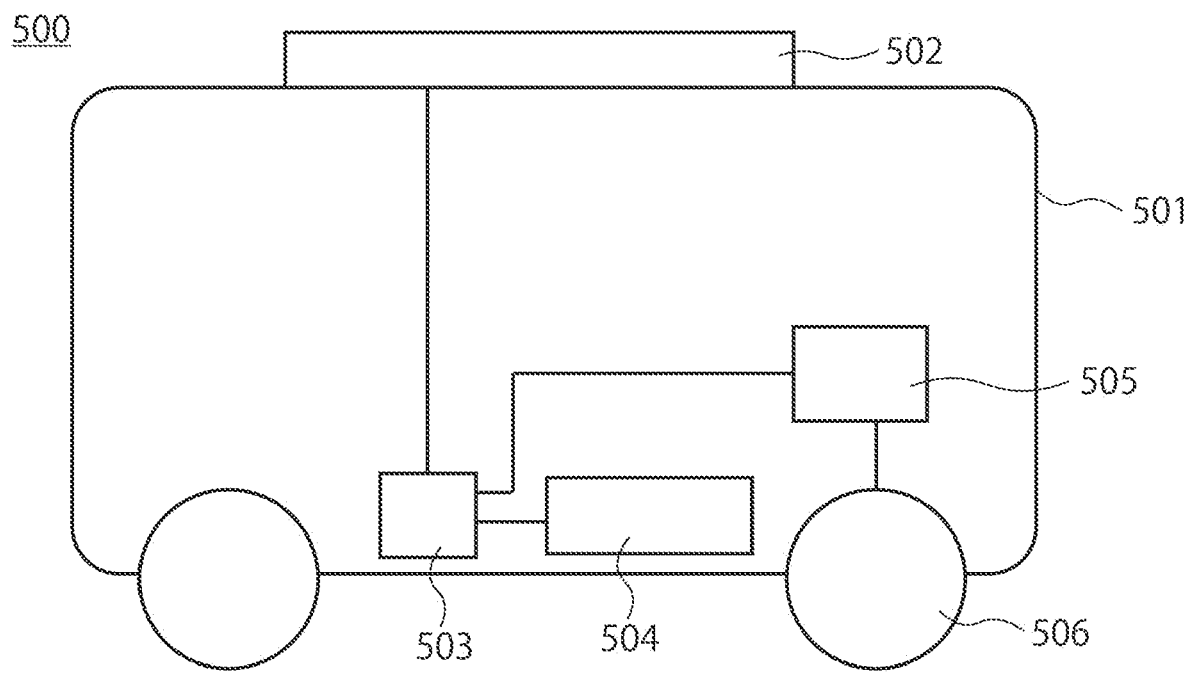
FIG. 15 is a conceptual diagram of a vehicle of an embodiment.

A vehicle is described as an example of utilization of the solar photovoltaic power generation system 400. FIG. 15 illustrates a conceptual configuration diagram of a vehicle 500. The vehicle 500 in FIG. 15 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Hereinafter, the present disclosure will be described more specifically based on Examples, but the present disclosure is not limited to the following Examples.

Example 1

First, a resist pattern was formed on a p-electrode to form, on a glass substrate, a linear wiring of Ag (second p-electrode (aperture ratio: 97.5%, pitch: 200 µm, line width: 5 µm, wire height: 1 µm)) with ITO (third p-electrode (In:Sn=80:20, film thickness 20 nm)) on the upper surface, the linear wiring of Ag being on the side in contact with the glass, as the p-electrode on the back surface side. In the resist pattern, there is a resist film in a region to be an opening of a linear wiring of Ag, and there is no resist film in a region to be a wiring portion. The resist pattern was formed by a nanoimprint method. Next, Ag (film thickness 1 µm) and ITO (film thickness 20 nm) are sequentially deposited. Next, the resist film was removed with a chemical agent, and the Ag film and the ITO film on the resist film were selectively removed to form the linear wiring of Ag with ITO only on the upper surface. After that, 0.15 µm of an ATO (first p-electrode (antimony-doped tin oxide) transparent conductive film (Sn:Sb=98:2)) is deposited. A $Cu_2O$ light absorbing layer is deposited on the transparent p-electrode by heating at 500° C. by a sputtering method in an oxygen and argon gas atmosphere. After that, a ZnGeO oxide is deposited as an n-type layer by a sputtering method at room temperature, and an AZO transparent conductive film is deposited as an n-electrode on the surface side, to obtain a solar cell. The series resistance, translucency, conversion efficiency, and peel strength (peel test) of the obtained solar cell are evaluated.

Tables 1 to 3 show the conditions of the p-electrode of Examples and Comparative Examples. Tables 1 shows the conditions of the first p-electrode 2a. Table 2 shows the conditions of the second p-electrode 2b. Table 2 shows the aperture ratios of the second p-electrode 2b. Table 3 shows the conditions of the third p-electrode 2c.

TABLE 1

| | First p-electrode | | |
|---|---|---|---|
| | Composition | Thickness [µm] | Place |
| Example 1 | ATO Sn:Sb = 98:2 | 0.15 | Whole area |
| Example 2 | ATO Sn:Sb = 98:2 | 0.15 | Whole area |
| Example 3 | ATO Sn:Sb = 98:2 | 0.15 | Whole area |
| Example 4 | ATO Sn:Sb = 98:2 | 0.15 | Whole area |
| Example 5 | ATO(Sn:Sb = 98:2) | 0.15 | Whole area |
| Example 6 | ATO Sn:Sb = 98:2 | 0.15 | Whole area |
| Example 7 | ATO Sn:Sb = 98:2 | 0.15 | Whole area |
| Example 8 | ATO Sn:Sb = 95:5 | 0.15 | Whole area |
| Example 9 | In:Sn = 50:50 | 0.15 | Whole area |
| Example 10 | Non-doped $SnO_2$ | 0.15 | Whole area |
| Example 11 | ATO(Sn:Sb = 98:2) | 0.15 | Whole area |
| Example 12 | ATO(Sn:Sb = 98:2) + Ag layer (thickness 0.5 nm) | 0.15 | Whole area |
| Example 13 | ATO(Sn:Sb = 98:2) + Ag layer (thickness 5 nm) | 0.15 | Whole area |
| Example 14 | ATO(Sn:Sb = 98:2) + Ag layer (thickness 7 nm) | 0.15 | Whole area |
| Example 15 | ATO(Sn:Sb = 98:2) + Ag layer (thickness 10 nm) | 0.15 | Whole area |
| Example 16 | ATO(Sn:Sb = 98:2) + Ag layer (thickness 6 nm) | 0.15 | Whole area |
| Example 17 | ATO(Sn:Sb = 98:2) + Ag layer (thickness 5 nm) | 0.15 | Whole area |
| Example 18 | ATO Sn:Sb = 98:2 | 0.15 | Whole area |
| Example 19 | ATO Sn:Sb = 98:2 | 0.15 | Whole area |
| Example 20 | ATO Sn:Sb = 98:2 | 0.15 | Whole area |
| Example 21 | ATO Sn:Sb = 98:2 | 0.15 | Whole area |
| Example 22 | ATO Sn:Sb = 98:2 | 0.15 | Whole area |
| Example 23 | ATO Sn:Sb = 98:2 | 0.15 | Whole area |
| Example 24 | ATO Sn:Sb = 98:2 | 0.15 | Whole area |
| Example 25 | ATO Sn:Sb = 98:2 | 0.15 | Whole area |
| Example 26 | ATO Sn:Sb = 98:2 | 0.05 | Whole area |
| Example 27 | ATO Sn:Sb = 98:2 | 0.01 | Whole area |
| Example 28 | ATO Sn:Sb = 98:2 | 0.5 | Whole area |
| Example 29 | ATO Sn:Sb = 98:2 | 1 | Whole area |
| Example 30 | ATO Sn:Sb = 98:2 | 0.15 | Whole area |
| Example 31 | ATO Sn:Sb = 98:2 | 0.15 | Whole area |
| Example 32 | ATO Sn:Sb = 98:2 | 0.15 | Whole area |
| Example 33 | ATO Sn:Sb = 98:2 | 0.15 | Whole area |
| Example 34 | ATO Sn:Sb = 98:2 | 0.15 | Whole area |
| Example 35 | ATO Sn:Sb = 98:2 | 0.15 | Whole area |
| Example 36 | ATO Sn:Sb = 98:2 | 0.15 | Whole area |
| Example 37 | ATO Sn:Sb = 98:2 | 0.15 | Whole area |
| Comparative Example 1 | ATO Sn:Sb = 98:2 | 0.15 | Whole area |
| Comparative Example 2 | ATO Sn:Sb = 98:2 | 0.15 | Whole area |
| Comparative Example 3 | ATO Sn:Sb = 98:2 | 0.15 | Whole area |
| Comparative Example 4 | ATO Sn:Sb = 98:2 | 0.15 | Whole area |
| Comparative Example 5 | ATO Sn:Sb = 98:2 | 0.15 | Whole area |
| Comparative Example 6 | ITO In:Sn = 80:20 | 0.15 | ITO over whole area |
| Comparative Example 7 | ITO In:Sn = 80:20 | 0.15 | ITO over whole area |
| Comparative Example 8 | ATO Sn:Sb = 98:2 | 0.15 | Whole area |
| Comparative Example 9 | ATO Sn:Sb = 98:2 | 0.15 | Whole area |

TABLE 2

| | Second p-electrode | | | | | |
|---|---|---|---|---|---|---|
| | Composition | Shape | Aperture rate [%] | Pitch P1 [µm] | Pitch P2 [µm] *in the case of mesh | Line width [µm] | Height [µm] |
| Example 1 | Ag | Line | 97.5% | 200 | — | 5 | 1 |
| Example 2 | Cu | Line | 97.1% | 175 | — | 5 | 0.3 |
| Example 3 | Al | Line | 97.1% | 175 | — | 5 | 0.5 |
| Example 4 | Mo | Line | 97.2% | 180 | — | 5 | 0.5 |
| Example 5 | W | Line | 97.1% | 175 | — | 5 | 1 |
| Example 6 | Ta | Line | 97.1% | 175 | — | 5 | 1 |
| Example 7 | Ag + Cu (Ag:Cu = 95:5) | Line | 97.5% | 200 | — | 5 | 1 |
| Example 8 | Ag | Line | 97.5% | 200 | — | 5 | 0.5 |
| Example 9 | Ag | Line | 97.5% | 200 | — | 5 | 0.3 |

TABLE 2-continued

| | Second p-electrode | | | | | |
|---|---|---|---|---|---|---|
| | Composition | Shape | Aperture rate [%] | Pitch P1 [μm] | Pitch P2 [μm] *in the case of mesh | Line width [μm] | Height [μm] |
| Example 10 | Ag | Line | 97.5% | 200 | — | 5 | 0.5 |
| Example 11 | Ag | Regular mesh | 90.2% | 185 | 1,000 | 15.5 | 0.8 |
| Example 12 | Ag | Regular mesh | 90.2% | 185 | 1,000 | 15.5 | 0.8 |
| Example 13 | Ag | Regular mesh | 93.1% | 300 | 300 | 10.5 | 0.8 |
| Example 14 | Ag | Regular mesh | 95.0% | 160 | 1,000 | 7 | 0.8 |
| Example 15 | Ag | Regular mesh | 99.0% | 200 | 1,000 | 1.7 | 0.8 |
| Example 16 | Ag | Regular mesh | 97.0% | 200 | 1,000 | 5 | 0.8 |
| Example 17 | Ag | Irregular mesh like a ghost leg | 98.0% | 200 | — | 5 | 1.2 |
| Example 18 | Ag | Irregular mesh like a ghost leg | 95.0% | 200 | — | 5 | 1.2 |
| Example 19 | Graphene (transfer) | Line | 97.5% | 200 | — | 5 | 1 |
| Example 20 | Ag | Line | 99.99% | 50000 | — | 5 | 1 |
| Example 21 | Ag | Line | 99.0% | 1000 | — | 10 | 1 |
| Example 22 | Ag | Line | 95.0% | 500 | — | 25 | 1 |
| Example 23 | Ag | Line | 90.0% | 50 | — | 5 | 1 |
| Example 24 | Ag | Line | 80.0% | 0.5 | — | 0.1 | 1 |
| Example 25 | Ag | Line | 99.0% | 3000 | — | 30 | 1 |
| Example 26 | Ag | Line | 97.5% | 200 | — | 5 | 2 |
| Example 27 | Ag | Line | 97.5% | 200 | — | 5 | 1 |
| Example 28 | Ag | Line | 97.5% | 200 | — | 5 | 200 |
| Example 29 | Ag | Line | 97.5% | 200 | — | 5 | 1 |
| Example 30 | Ag | Line | 97.5% | 200 | — | 5 | 1 |
| Example 31 | Ag | Line | 97.5% | 200 | — | 5 | 1 |
| Example 32 | Ag | Line | 97.5% | 200 | — | 5 | 1 |
| Example 33 | Ag | Line | 97.5% | 200 | — | 5 | 1 |
| Example 34 | Ag | Line | 97.5% | 200 | — | 5 | 1 |
| Example 35 | Ag | Line | 97.5% | 200 | — | 5 | 1 |
| Example 36 | Ag | Line | 97.5% | 200 | — | 5 | 1 |
| Example 37 | Ag | Line (damascene) | 97.5% | 200 | — | 5 | 1 |
| Comparative Example 1 | Au | Film | 0.0% | — | — | — | 5 |
| Comparative Example 2 | Ag | Line | 97.5% | 200 | — | 5 | 1 |
| Comparative Example 3 | ITO In:Sn = 80:20 | Line | 97.5% | 200 | — | 5 | 1 |
| Comparative Example 4 | Ag | Line | 97.5% | 200 | — | 5 | 1 |
| Comparative Example 5 | Ag | Line | 97.5% | 200 | — | 5 | 1 |
| Comparative Example 6 | Ag | Line | 97.5% | 200 | — | 5 | 1 |
| Comparative Example 7 | Ag | Line | 97.5% | 200 | — | 5 | 1 |
| Comparative Example 8 | Ag | Regular mesh | 88.8% | 175 | 1,000 | 17 | 0.8 |
| Comparative Example 9 | Ag | Line (damascene) | 97.5% | 200 | — | 5 | 1 |
| Comparative Example 10 | Graphene (transfer) | Line | 97.5% | 200 | — | 5 | 1 |

TABLE 3

| | Third p-electrode | | |
|---|---|---|---|
| | Composition | Thickness | Place |
| Example 1 | ITO In:Sn = 80:20 | 20 nm | Entire upper surface |
| Example 2 | ITO In:Sn = 82:18 | 20 nm | Entire upper surface |
| Example 3 | ITO In:Sn = 80:20 | 20 nm | Entire upper surface |
| Example 4 | ITO In:Sn = 85:15 | 20 nm | Entire upper surface |
| Example 5 | ITO In:Sn = 79:21 | 20 nm | Entire upper surface |
| Example 6 | ITO In:Sn = 90:10 | 20 nm | Entire upper surface |
| Example 7 | ITO In:Sn = 81:19 | 20 nm | Entire upper surface |
| Example 8 | ITO In:Sn = 75:25 | 20 nm | Entire upper surface |
| Example 9 | ITO In:Sn = 80:20 | 20 nm | Entire upper surface |
| Example 10 | ITO In:Sn = 78:22 | 20 nm | Entire upper surface |
| Example 11 | ITO In:Sn = 78:22 | 20 nm | Entire upper surface |
| Example 12 | ITO In:Sn = 81:19 | 20 nm | Entire upper surface |
| Example 13 | ITO In:Sn = 95:5 | 20 nm | Entire upper surface |
| Example 14 | ITO In:Sn = 81:19 | 20 nm | Entire upper surface |
| Example 15 | ITO In:Sn = 83:17 | 20 nm | Entire upper surface |
| Example 16 | ITO In:Sn = 82:18 | 20 nm | Entire upper surface |
| Example 17 | ITO In:Sn = 80:20 | 20 nm | Entire upper surface |
| Example 18 | ITO In:Sn = 80:20 | 20 nm | Entire upper surface |
| Example 19 | ITO In:Sn = 65:35 | 20 nm | Entire upper surface |
| Example 20 | ITO In:Sn = 70:30 | 20 nm | Entire upper surface |
| Example 21 | ITO In:Sn = 80:20 | 20 nm | Entire upper surface |
| Example 22 | ITO In:Sn = 80:20 | 20 nm | Entire upper surface |
| Example 23 | ITO In:Sn = 81:19 | 20 nm | Entire upper surface |
| Example 24 | ITO In:Sn = 81:19 | 20 nm | Entire upper surface |
| Example 25 | ITO In:Sn = 83:17 | 20 nm | Entire upper surface |
| Example 26 | ITO In:Sn = 80:20 | 20 nm | Entire upper surface |
| Example 27 | ITO In:Sn = 79:21 | 20 nm | Entire upper surface |
| Example 28 | ITO In:Sn = 82:18 | 20 nm | Entire upper surface |
| Example 29 | ITO In:Sn = 80:20 | 20 nm | Entire upper surface |
| Example 30 | ITO In:Sn = 79:21 | 1 nm | Entire upper surface |
| Example 31 | ITO In:Sn = 80:20 | 5 nm | Entire upper surface |
| Example 32 | ITO In:Sn = 80:20 | 30 nm | Entire upper surface |
| Example 33 | ITO In:Sn = 80:20 | 50 nm | Entire upper surface |
| Example 34 | ITO In:Sn = 79:21 | 100 nm | Entire upper surface |
| Example 35 | ITO In:Sn = 80:20 | 20 nm | Entire upper surface |
| Example 36 | ITO In:Sn = 80:20 | 20 nm | Entire upper surface |
| Example 37 | ITO In:Sn = 80:20 | 20 nm | Entire upper surface |
| Comparative Example 1 | ITO In:Sn = 88:12 | 20 nm | Whole area |
| Comparative Example 2 | ITO In:Sn = 79:21 | 20 nm | Entire upper surface and entire side surface |
| Comparative Example 3 | None | None | None |
| Comparative Example 4 | None | — | — |
| Comparative Example 5 | ITO In:Sn = 80:20 | 20 nm | Only side surface |
| Comparative Example 6 | None | — | — |
| Comparative Example 7 | ATO Sn:sb = 98:2 | 20 nm | Only upper surface |
| Comparative Example 8 | None | — | — |
| Comparative Example 9 | ITO In:Sn = 81:19 | 20 nm | Entire upper surface and entire side surface |
| Comparative Example 10 | ITO In:Sn = 83:17 | 20 nm | Entire upper surface and entire side surface |

The series resistance of the solar cell is obtained before the peel test. With a solar simulator that simulates a light source of AM1.5G, the light amount is adjusted to 1 sun with a reference Si cell under the light source. The air temperature is 25° C. The voltage is swept and the current density (current divided by cell area) is measured. When the horizontal axis represents the voltage and the vertical axis represents the current density, a point intersecting with the horizontal axis represents the open circuit voltage Voc, and a point intersecting with the vertical axis represents the short circuit current density Jsc. On the measurement curve, the differential resistance at the open circuit voltage at which the current density becomes zero is the series resistance of the solar cell.

The translucency of the solar cell is evaluated before the peel test. The transmittance of the solar cell is an average transmittance when a wavelength of 700 to 1200 nm was measured with a spectrophotometer.

The conversion efficiency is obtained before the peel test. With a solar simulator that simulates a light source of AM1.5G, the light amount is adjusted to 1 sun with a reference Si cell under the light source. The air temperature is 25° C. The voltage is swept and the current density (current divided by cell area) is measured. When the horizontal axis represents the voltage and the vertical axis represents the current density, a point intersecting with the horizontal axis represents the open circuit voltage Voc, and a point intersecting with the vertical axis represents the short circuit current density Jsc. When the voltage and the current density are multiplied on the measurement curve, and the maximum point of the voltage is Vmpp and the maximum point of the current density is Jmpp (maximum power points), FF=(Vmpp*Jmpp)/(Voc*Jsc) is satisfied. The conversion efficiency Eff. is obtained by Eff.=Voc*Jsc*FF.

After measuring the translucency and conversion efficiency of the solar cell, the peel test is performed. For the peel test, a cross-cut tape method was used. First, cuts are made with a cutter knife blade from the surface of the n-electrode toward the glass substrate to form a total of 100 squares by 10 squares in length and 10 squares in width, each square having a size of 5 mm×5 mm. Next, an adhesive tape is attached to the surface of the cut thin film, and the adhesive tape is sufficiently brought into close contact with the thin film. Finally, an end of the tape is held and kept at a right angle to the coating film surface, and the tape is instantaneously peeled off. The adhesion was evaluated on a scale of eleven points of 0 (no peeling), 1 (1 to 10 peeled squares), 2 (11 to 20 peeled squares), 3 (21 to 30 peeled squares), 4 (31 to 40 peeled squares), 5 (41 to 50 peeled squares), 6 (51 to 60 peeled squares), 7 (61 to 70 peeled squares), 8 (71 to 80 peeled squares), 9 (81 to 90 peeled squares), and 10 (91 to 100 peeled squares) according to the number of peeled squares.

The test sample used for the peel test is a solar cell formed up to the n-electrode. Because a solar cell is used as a sample, any cover glass or the like provided on the n-electrode side that obstructs the peel test is removed before the peel test.

Table 4 shows the evaluation results of the peel test, series resistance, translucency, and conversion efficiency of Examples and Comparative Examples.

Example 2

As the wiring having a line shape, a linear wiring of Cu having a pitch of 175 nm, a line width of 5 μm, and a height of 0.3 μm is formed instead of Ag. Then, as the third p-electrode, an ITO film having a ratio of In to Sn of 82:18 is formed on the upper surface of the linear wiring of Cu. A solar cell is obtained in the same manner as in Example 1 except for the above. The obtained solar cell is evaluated in the same manner as in Example 1, and the results are shown in Table 4.

Example 3

As the linear wiring, a linear wiring of Al having a pitch of 175 nm, a line width of 5 μm, and a height of 0.5 μm is formed instead of Ag. A solar cell is obtained in the same manner as in Example 1 except for this. The obtained solar cell is evaluated in the same manner as in Example 1, and the results are shown in Table 4.

Example 4

As the linear wiring, a linear wiring of Mo having a pitch of 180 nm, a line width of 5 μm, and a height of 0.5 μm is formed instead of Ag. Then, as the third p-electrode, an ITO film having a ratio of In to Sn of In:Sn of 85:15 is formed on the upper surface of the linear wiring of Mo. A solar cell is obtained in the same manner as in Example 1 except for the above. The obtained solar cell is evaluated in the same manner as in Example 1, and the results are shown in Table 4.

Example 5

As the linear wiring, a linear wiring of W having a pitch of 175 nm, a line width of 5 μm, and a height of 1 μm is formed instead of Ag. Then, as the third p-electrode, an ITO film having a ratio of In to Sn of 79:21 is formed on the upper surface of the linear wiring of W. A solar cell is obtained in the same manner as in Example 1 except for the above. The obtained solar cell is evaluated in the same manner as in Example 1, and the results are shown in Table 4.

Example 6

As the linear wiring, a linear wiring of Ta having a pitch of 175 nm, a line width of 5 μm, and a height of 1 μm is formed instead of Ag. Then, as the third p-electrode, an ITO film having a ratio of In to Sn of 90:10 is formed on the upper surface of the linear wiring of Ta. A solar cell is obtained in the same manner as in Example 1 except for the above. The obtained solar cell is evaluated in the same manner as in Example 1, and the results are shown in Table 4.

Example 7

As the linear wiring, a linear wiring of Ag—Cu alloy (Ag:Cu=95:5) having a pitch of 200 nm, a line width of 5 μm, and a height of 1 μm is formed instead of Ag. Then, as the third p-electrode, an ITO film having a ratio of In:Sn=81:19 is formed on the upper surface of the linear wiring of the alloy. A solar cell is obtained in the same manner as in Example 1 except for the above. The obtained solar cell is evaluated in the same manner as in Example 1, and the results are shown in Table 4.

Example 8

A linear wiring of Ag having a height of 0.5 μm is formed. Then, as the third p-electrode, an ITO film having a ratio of In:Sn=75:25 is formed on the upper surface of the linear wiring of Ag. Then, an ATO film of Sn:Sb=95:5 is formed as the first p-electrode. A solar cell is obtained in the same manner as in Example 1 except for the above. The obtained solar cell is evaluated in the same manner as in Example 1, and the results are shown in Table 4.

Example 9

A linear wiring of Ag having a height of 0.3 μm is formed. Then, a composite oxide film of In and Sn having a ratio of In:Sn=1:1 is formed as the first p-electrode. A solar cell is obtained in the same manner as in Example 1 except for the above. The obtained solar cell is evaluated in the same manner as in Example 1, and the results are shown in Table 4.

Example 10

A linear wiring of Ag having a height of 0.5 μm is formed. Then, as the third p-electrode, an ITO film having a ratio of In:Sn=78:22 is formed on the upper surface of the linear wiring of Ag. Then, a non-doped $SnO_2$ film is formed as the first p-electrode. A solar cell is obtained in the same manner as in Example 1 except for the above. The obtained solar cell is evaluated in the same manner as in Example 1, and the results are shown in Table 4.

Example 11

A regular mesh wiring of Ag (narrower pitch P1: 185 μm, wider pitch P2: 1000 μm, line width 15.5 μm, height 0.8 μm) is formed instead of the linear wiring. Then, as the third p-electrode, an ITO film having a ratio of In:Sn=78:22 is formed on the upper surface of the mesh wiring of Ag. Then, an ATO film is formed as the first p-electrode in such a manner that the ATO film covers the glass substrate and the mesh wiring of Ag on which the ITO film is formed on the upper surface. A solar cell is obtained in the same manner as in Example 1 except for the above. The obtained solar cell is evaluated in the same manner as in Example 1, and the results are shown in Table 4.

Example 12

As the third p-electrode, an ITO film having a ratio of In:Sn=81:19 is formed on the upper surface of the mesh wiring of Ag. Then, an Ag film (metal layer) having a thickness of 0.5 nm is deposited in the process of forming the ATO film such that the Ag film is formed near the center of the ATO film of the first p-electrode in the thickness direction. A solar cell is obtained in the same manner as in Example 11 except for the above. The obtained solar cell is evaluated in the same manner as in Example 1. The results are shown in Table 4.

Example 13

A regular mesh wiring of Ag having a narrower pitch P1 and a wider pitch P2 both of 300 μm and a line width of 10.5 μm is formed. Then, as the third p-electrode, an ITO film having a ratio of In:Sn=95:5 is formed on the upper surface of the mesh wiring of Ag. An Ag film (metal layer) having a film thickness of 5 nm is formed near the center of the ATO film of the first p-electrode in the thickness direction. A solar cell is obtained in the same manner as in Example 12 except for the above. The obtained solar cell is evaluated in the same manner as in Example 1. The results are shown in Table 4.

Example 14

A regular mesh wiring of Ag having a narrower pitch P1 of 160 μm, a wider pitch P2 of 1000 μm, and a line width of 7 μm is formed. Then, as the third p-electrode, an ITO film having a ratio of In:Sn=81:19 is formed on the upper surface of the mesh wiring of Ag. An Ag film (metal layer) having a film thickness of 7 nm is formed near the center of the ATO film of the first p-electrode in the thickness direction. A solar cell is obtained in the same manner as in Example 12 except for the above. The obtained solar cell is evaluated in the same manner as in Example 1. The results are shown in Table 4.

Example 15

A regular mesh wiring of Ag having a narrower pitch P1 of 200 µm, a wider pitch P2 of 1000 µm, and a line width of 1.7 µm is formed. Then, as the third p-electrode, an ITO film having a ratio of In:Sn=83:17 is formed on the upper surface of the mesh wiring of Ag. An Ag film (metal layer) having a film thickness of 10 nm is formed near the center of the ATO film of the first p-electrode in the thickness direction. A solar cell is obtained in the same manner as in Example 12 except for the above. The obtained solar cell is evaluated in the same manner as in Example 1. The results are shown in Table 4.

Example 16

A regular mesh wiring of Ag having a narrower pitch P1 of 200 µm, a wider pitch P2 of 1000 µm, and a line width is 5 µm is formed. Then, as the third p-electrode, an ITO film having a ratio of In:Sn=82:18 is formed on the upper surface of the mesh wiring of Ag. An Ag film (metal layer) having a film thickness of 6 nm is formed near the center of the ATO film of the first p-electrode in the thickness direction. A solar cell is obtained in the same manner as in Example 12 except for the above. The obtained solar cell is evaluated in the same manner as in Example 1. The results are shown in Table 4.

Example 17

A mesh wiring of Ag having a line width of 5 µm and a wire height of 1.2 µm is formed like a ghost leg, in which a wiring of Ag having random lengths and random intervals intersect with a regular linear wiring of Ag having a pitch of 200 µm. Then, as the third p-electrode, an ITO film having a ratio of In:Sn=80:20 is formed on the upper surface of the mesh wiring of Ag. An Ag film (metal layer) having a film thickness of 5 nm is formed near the center of the ATO film of the first p-electrode in the thickness direction. A solar cell is obtained in the same manner as in Example 12 except for the above. The obtained solar cell is evaluated in the same manner as in Example 1. The results are shown in Table 4.

Example 18

A mesh wiring of Ag having a line width of 5 µm and a wire height of 1.2 µm is formed like a ghost leg, in which the lengths and the intervals of the wiring of Ag intersecting with the regular linear wiring of Ag having a pitch of 200 µm are changed from those in Example 17. Then, as the third p-electrode, an ITO film having a ratio of In:Sn=80:20 is formed on the upper surface of the mesh wiring of Ag. An ATO film is formed as the first p-electrode without forming a metal layer. A solar cell is obtained in the same manner as in Example 16 except for the above. The obtained solar cell is evaluated in the same manner as in Example 1. The results are shown in Table 4.

Example 19

A linear wiring of graphene having a pitch of 200 µm, a line width of 5 µm, and a wire height of 1 µm is formed by transferring onto a substrate. Then, a solar cell is obtained in the same manner as in Example 1 except that an ITO film having a ratio of In:Sn=65:35 is formed on the upper surface of the linear wiring of graphene as the third p-electrode. The obtained solar cell is evaluated in the same manner as in Example 1. The results are shown in Table 4.

Example 20

A linear wiring of Ag having a pitch of 50,000 µm is formed. Then, as the third p-electrode, an ITO film having a ratio of In:Sn=70:30 is formed on the upper surface of the linear wiring of Ag. A solar cell is obtained in the same manner as in Example 1 except for the above. The obtained solar cell is evaluated in the same manner as in Example 1, and the results are shown in Table 4.

Example 21

A linear wiring of Ag having a pitch of 1000 µm and a line width of 10 µm is formed. A solar cell is obtained in the same manner as in Example 1 except for this. The obtained solar cell is evaluated in the same manner as in Example 1, and the results are shown in Table 4.

Example 22

A linear wiring of Ag having a pitch of 500 µm and a line width of 25 µm is formed. A solar cell is obtained in the same manner as in Example 1 except for this. The obtained solar cell is evaluated in the same manner as in Example 1, and the results are shown in Table 4.

Example 23

A linear wiring of Ag having a pitch of 50 µm is formed. Then, as the third p-electrode, an ITO film having a ratio of In:Sn=81:19 is formed on the upper surface of the linear wiring of Ag. A solar cell is obtained in the same manner as in Example 1 except for the above. The obtained solar cell is evaluated in the same manner as in Example 1, and the results are shown in Table 4.

Example 24

A linear wiring of Ag having a pitch of 0.5 µm and a line width of 0.1 µm is formed. A solar cell is obtained in the same manner as in Example 1 except for this. The obtained solar cell is evaluated in the same manner as in Example 23. The results are shown in Table 4.

Example 25

A linear wiring of Ag having a pitch of 3000 µm and a line width of 30 µm is formed. Then, as the third p-electrode, an ITO film having a ratio of In:Sn=83:17 is formed on the upper surface of the linear wiring of Ag. A solar cell is obtained in the same manner as in Example 1 except for the above. The obtained solar cell is evaluated in the same manner as in Example 1, and the results are shown in Table 4.

Example 26

A linear wiring of Ag having a height of 2 µm is formed. Then, ATO (Sn:Sb=98:2) having a thickness of 0.05 µm is deposited as the first p-electrode. A solar cell is obtained in the same manner as in Example 1 except for the above. The obtained solar cell is evaluated in the same manner as in Example 1, and the results are shown in Table 4.

Example 27

As the third p-electrode, an ITO film having a ratio of In:Sn=79:21 is formed on the upper surface of the linear wiring of Ag. Then, ATO (Sn:Sb=98:2) having a thickness of 0.01 µm is deposited as the first p-electrode. A solar cell is obtained in the same manner as in Example 1 except for the above. The obtained solar cell is evaluated in the same manner as in Example 1, and the results are shown in Table 4.

Example 28

A linear wiring of Ag having a height of 200 µm is formed. As the third p-electrode, an ITO film having a ratio of In:Sn=82:18 is formed on the upper surface of the linear wiring of Ag. Then, ATO (Sn:Sb=98:2) having a thickness of 0.5 µm is deposited as the first p-electrode. A solar cell is obtained in the same manner as in Example 1 except for the above. The obtained solar cell is evaluated in the same manner as in Example 1, and the results are shown in Table 4.

Example 29

As the first p-electrode, ATO (Sn:Sb=98:2) having a thickness of 1 µm is deposited. A solar cell is obtained in the same manner as in Example 1 except for this. The obtained solar cell is evaluated in the same manner as in Example 1, and the results are shown in Table 4.

Example 30

As the third p-electrode, an ITO film having a thickness of 1 nm and a ratio of In:Sn=79:21 is formed on the upper surface of the linear wiring of Ag. A solar cell is obtained in the same manner as in Example 1 except for this. The obtained solar cell is evaluated in the same manner as in Example 1, and the results are shown in Table 4.

Example 31

An ITO film having a thickness of 5 nm is formed as the third p-electrode on the upper surface of the linear wiring of Ag. A solar cell is obtained in the same manner as in Example 1 except for this. The obtained solar cell is evaluated in the same manner as in Example 1, and the results are shown in Table 4.

Example 32

As the third p-electrode, an ITO film having a thickness of 30 nm is formed on the upper surface of the linear wiring of Ag. A solar cell is obtained in the same manner as in Example 1 except for this. The obtained solar cell is evaluated in the same manner as in Example 1, and the results are shown in Table 4.

Example 33

As the third p-electrode, an ITO film having a thickness of 50 nm is formed on the upper surface of the linear wiring of Ag. A solar cell is obtained in the same manner as in Example 1 except for this. The obtained solar cell is evaluated in the same manner as in Example 1, and the results are shown in Table 4.

Example 34

As the third p-electrode, an ITO film having a thickness of 100 nm and a ratio of In:Sn=79:21 is formed on the upper surface of the linear wiring of Ag. A solar cell is obtained in the same manner as in Example 1 except for this. The obtained solar cell is evaluated in the same manner as in Example 1, and the results are shown in Table 4.

Example 35

An ITO film to be processed for the fourth p-electrode having a thickness of 5 µm and a ratio of In:Sn=80:20 is formed on a glass substrate. After that, an Ag film to be processed for the second p-electrode is formed. Then, the Ag film and the ITO film on the resist film were selectively removed to form a linear wiring of Ag with ITO on the upper and lower surfaces. A solar cell is obtained in the same manner as in Example 1 except for the above. The obtained solar cell is evaluated in the same manner as in Example 1, and the results are shown in Table 4.

Example 36

An ITO film having a thickness of 20 µm to be processed for the fourth p-electrode is formed. A solar cell is obtained in the same manner as in Example 35 except for this. The obtained solar cell is evaluated in the same manner as in Example 1, and the results are shown in Table 4.

Example 37

A groove having a width of 5 µm, a depth of 1.1 µm, and a pitch of 200 µm is formed on a glass substrate. Then, an Ag film having a thickness of 1 µm is formed on the glass substrate, and then an ITO film having a thickness of 200 nm is formed. After these films are formed, the ITO film was polished by chemical mechanical polishing (CMP) to have a thickness of 20 nm. A solar cell is obtained in the same manner as in Example 1 except for the above. The obtained solar cell is evaluated in the same manner as in Example 1, and the results are shown in Table 4.

Comparative Example 1

In the solar cell of Comparative Example 1, an Au film having a thickness of 5 µm is formed over the whole area of a surface of a glass substrate instead of the linear wiring of Ag. Then, as the third p-electrode, an ITO film having a thickness of 20 nm and a ratio of In:Sn=88:12 is formed on the upper surface of the Au film. A solar cell is obtained in the same manner as in Example 1 except for the above. The obtained solar cell is evaluated in the same manner as in Example 1, and the results are shown in Table 4.

Comparative Example 2

An ITO film having a ratio of In:Sn=79:21 is formed on a glass substrate and on an upper surface and side surfaces of the linear wiring of Ag. A solar cell is obtained in the same manner as in Example 35 except for this. The obtained solar cell is evaluated in the same manner as in Example 1, and the results are shown in Table 4.

Comparative Example 3

A wiring of ITO having a pitch of 200 μm, a line width of 5 μm, and a thickness of 1 μm and having a ratio of In:Sn=80:20 is formed instead of the linear wiring of Ag. A light absorbing layer is formed without forming the third p-electrode. A solar cell is obtained in the same manner as in Example 1 except for this. The obtained solar cell is evaluated in the same manner as in Example 1, and the results are shown in Table 4.

Comparative Example 4

A light absorbing layer is formed on a glass substrate and the linear wiring of Ag without forming the ITO film of the third p-electrode. A solar cell is obtained in the same manner as in Example 1 except for this. The obtained solar cell is evaluated in the same manner as in Example 1, and the results are shown in Table 4.

Comparative Example 5

A light absorbing layer is formed with the ITO film of the third p-electrode formed on the side surfaces of the linear wiring of Ag but not formed on the upper surface of the linear wiring of Ag. A solar cell is obtained in the same manner as in Example 1 except for this. The obtained solar cell is evaluated in the same manner as in Example 1, and the results are shown in Table 4.

Comparative Example 6

Instead of the ATO film of the first p-electrode, an ITO film having a thickness of 0.15 μm and a ratio of In: Sn=80:20 is formed on a glass substrate and on the side surfaces and the upper surface of a linear wiring of Ag, and a light absorbing layer is formed without forming the ITO film of the third p-electrode. A solar cell is obtained in the same manner as in Example 1 except for this. The obtained solar cell is evaluated in the same manner as in Example 1, and the results are shown in Table 4.

Comparative Example 7

An ATO film having a thickness of 20 μm and ratio of Sn:Sb=98:2 is formed on the linear wiring of Ag instead of the ITO film of the third p-electrode. Then, an ITO film having a ratio of In:Sn=80:20 is formed instead of the ATO film of the first p-electrode. A solar cell is obtained in the same manner as in Example 1 except for the above. The obtained solar cell is evaluated in the same manner as in Example 1, and the results are shown in
Table 4.

Comparative Example 8

A regular mesh wiring of Ag having a line width of 17 μm is formed. Then, the first p-electrode is formed without forming the third p-electrode. A solar cell is obtained in the same manner as in Example 11 except for the above. The obtained solar cell is evaluated in the same manner as in Example 1, and the results are shown in Table 4.

Comparative Example 9

An ITO film having a ratio of In:Sn=81:19 is formed on a glass substrate and on the upper and side surfaces of the linear wiring of Ag. A solar cell is obtained in the same manner as in Example 37 except for this. The obtained solar cell is evaluated in the same manner as in Example 1, and the results are shown in Table 4.

Comparative Example 10

As the third p-electrode, an ITO film having a ratio of In:Sn=83:17 is formed on the upper and side surfaces of the linear wiring of graphene. A solar cell is obtained in the same manner as in Example 19 except for this. The obtained solar cell is evaluated in the same manner as in Example 1, and the results are shown in Table 4.

Table 4 collectively shows the peel test, series resistance, translucency, and conversion efficiency of Examples and Comparative Examples.

The peel test is performed 10 times. Based on the number of squares in which the p-electrode of the solar cell is peeled off, the case where all the tests had 0 in the scale of 0 to 10 (no squares peeled off for 10 times) is evaluated as S, the case where nine tests had 0 and one test had 1 is evaluated as A, the case where no more than eight tests had 0 and no less than two tests had 1 is evaluated as B, and the case where at least one test had anything from 2 to 10 is evaluated as C.

The series resistance is evaluated. Based on the series resistance of the solar cell of Comparative Example 2, the case where the series resistance is no more than 1/10 times of the series resistance of the solar cell of Comparative Example 2 is evaluated as A, the case where the series resistance is no less than 1/10 times and less than 1 time of the series resistance of the solar cell of Comparative Example 2 is evaluated as B, and the case where the series resistance is no less than one time of the series resistance of the solar cell of the Comparative Example 2 is evaluated as C.

The translucency is evaluated. The case where the light transmittance of light in a wavelength band of no less than 700 nm and no more than 1200 nm is no less than 75% is evaluated as A, the case where the light transmittance of light in a wavelength band of no less than 700 nm and more than 1200 nm is no less than 70% and less than 75% was evaluated as B, and the case where the light transmittance of light in a wavelength band of no less than 700 nm and no more than 1200 nm is less than 70% is evaluated as C.

The conversion efficiency is evaluated. The case where the conversion efficiency is no less than five times of the conversion efficiency of Comparative Example 2 is evaluated as A, the case where the conversion efficiency is no less than one time and less than five times of the conversion efficiency of Comparative Example 2 is evaluated as B, and the case where the conversion efficiency is less than one time than the conversion efficiency of Comparative Example 2 is evaluated as C.

[Table 4]

As can be seen from Table 4, in Comparative Example 1 (using ATO and an Au film), peeling occurred, and each evaluation of the peel test, the series resistance, the translucency, and the conversion efficiency was C. In Comparative Example 2 (wiring of Ag on ATO), the wiring of Ag was oxidized during the formation of the Cu$_2$O film to increase the resistance, and the evaluation of the series resistance and the conversion efficiency were both C. In Comparative Example 3 (no wiring of Ag), the series resistance and the conversion efficiency were also evaluated as C because the resistance of ATO was high. In Comparative Example 4 (no ATO), the wiring of Ag itself had low resistance, but the series resistance and the conversion efficiency were also evaluated as C because the electrical contact between $Cu_2O$ and Ag was poor.

In Examples 1 to 37, by providing a linear or meshed second p-electrode under the first p-electrode, each evaluation of the peel test, the series resistance, the translucency, and the conversion efficiency was improved to A except for some examples in which the evaluation was B. According to the configuration of the present embodiments, it is possible to simultaneously improve the peeling, resistance of the p-electrode, transmittance, and conversion efficiency, and it is possible to provide a solar cell that is transparent and excellent in peel strength, a multi-junction solar cell, a solar cell module, and a photovoltaic power generation system provided with the solar cell.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a transparent substrate;
   a p-electrode on the substrate, the p-electrode including a first p-electrode containing an Sn-based metal oxide, a second p-electrode having an opening and consisting of a wiring containing a metal or graphene, and a third p-electrode containing an In-based metal oxide;
   a p-type light absorbing layer in direct contact with a surface of the first p-electrode on a side opposite to the second p-electrode side;
   an n-type layer provided on the p-type light absorbing layer; and
   an n-electrode provided on the n-type layer,
   wherein the third p-electrode is provided to be present between the first p-electrode and the second p-electrode and to be in direct contact with an upper surface of the second p-electrode, and
   an entire side surface of the second p-electrode is in direct contact with the first p-electrode.

2. The solar cell according to claim 1, wherein the p-type light absorbing layer is a semiconductor layer of a Cu-based metal oxide.

3. The solar cell according to claim 1, wherein no less than 90 wt % of the first p-electrode is the Sn-based metal oxide,
   no less than 92 atom % of metals contained in the Sn-based metal oxide is Sn and no more than 8 atom % is at least one metal selected from the group consisting of Zn, Al, Ga, In, Si, Ge, Ti, Cu, Sb, Nb, F, and Ta, and
   the first p-electrode has a thickness of no less than 10 nm and no more than 500 nm.

4. The solar cell according to claim 1, wherein the wiring of the second p-electrode is a metal, graphene, a laminate of a metal and graphene, a laminate of a metal and a transparent conductive oxide, a laminate of graphene and an oxide transparent semiconductor, or a laminate of a metal, graphene, and a transparent conductive oxide, and
   the wiring of the second p-electrode has a thickness of no less than 200 nm and no more than 2 µm.

5. The solar cell according to claim 1, wherein the second p-electrode has an aperture ratio of no less than 90.00% and no more than 99.99%.

6. The solar cell according to claim 1, wherein no less than 60 wt % of the third p-electrode is the In-based metal oxide,
   no less than 70 atom % and no more than 95 atom % of metals contained in the In-based metal oxide in the third p-electrode is preferably In, and
   no less than 2 atom % and no more than 40 atom % of the metals contained in the In-based metal oxide in the third p-electrode is at least one metal selected from the group consisting of Sn, Sb, Ga, Ti, and Zn.

7. The solar cell according to claim 1, wherein the wiring has a line shape or a mesh shape.

8. The solar cell according to claim 1, wherein the first p-electrode includes a metal layer having a thickness of no more than 10 nm.

9. The solar cell according to claim 1, wherein the wiring has a line shape or a mesh shape, and
   a pitch of the wiring having the line shape and a narrower pitch of the wiring having the mesh shape are both no less than 100 µm and no more than 10,000 µm.

10. The solar cell according to claim 1, wherein the wiring has a line width of no less than 0.1 µm and no more than 25 µm.

11. The solar cell according to claim 9 satisfying $0.00001 \leq W/P0 \leq 0.1$ and $0.00001 \leq W/P1 \leq 0.1$, wherein P0 is the pitch of the wiring having the line shape, P1 is the narrower pitch of the wiring having the mesh shape, and W is the line width of the wiring.

12. The solar cell according to claim 1, wherein a whole area of a surface of the p-type light absorbing layer, the surface facing the first p-electrode, is in direct contact with the first p-electrode.

13. The solar cell according to claim 1, wherein a whole area of a surface of the p-type light absorbing layer, the surface facing the first p-electrode, is in direct contact with the Sn-based metal oxide in the first p-electrode.

14. The solar cell according to claim 1, wherein the first p-electrode has a thickness of no less than 0.02 times and no more than 0.5 times of the thickness of the second p-electrode.

15. The solar cell according to claim 1, further comprising a fourth p-electrode including an In-based metal oxide between the second p-electrode and the substrate.

16. The solar cell according to claim 1, wherein no less than 60 wt % of the fourth p-electrode is the In-based metal oxide,
   no less than 70 atom % and no more than 95 atom % of metals contained in the In-based metal oxide in the fourth p-electrode is preferably In, and
   no less than 2 atom % and no more than 40 atom % of the metals contained in the In-based metal oxide in the fourth p-electrode is at least one metal selected from the group consisting of Sn, Sb, Ga, Ti, and Zn.

17. The solar cell according to claim 1, wherein the p-type light absorbing layer is a layer of an oxide represented by $Cu_aM_bO_c$,
   wherein M is at least one metal selected from the group consisting of Sn, Sb, Ag, Li, Na, K, Cs, Rb, Al, Ga, In, Zn, Mg, and Ca, and
   a, b, and c satisfy $1.80 \leq a \leq 2.01$, $0.00 \leq b \leq 0.20$, and $0.98 \leq c \leq 1.02$.

18. A multi-junction solar cell comprising:
the solar cell according to claim 1; and
a solar cell having a light absorbing layer having a band gap smaller than that of the p-type light absorbing layer of the solar cell according to claim 1.

19. A solar cell module comprising the solar cell according to claim 1.

20. A photovoltaic power generation system comprising the solar cell module according to claim 19 to perform photovoltaic power generation.

* * * * *